United States Patent [19]
Yamauchi et al.

[11] Patent Number: 6,118,672
[45] Date of Patent: Sep. 12, 2000

[54] TUNER STRUCTURE AND CABLE MODEM TUNER USING THE SAME

[75] Inventors: Miyoshi Yamauchi, Osaka; Mitsuhiro Noboru, Tondabayashi; Haruo Koizumi, Sennan; Syuuji Matsuura, Ikoma; Toshifumi Akiyama, Kashihara, all of Japan

[73] Assignee: Sharp Kabushiki Kaisha, Osaka, Japan

[21] Appl. No.: 08/883,481

[22] Filed: Jun. 26, 1997

[30] Foreign Application Priority Data

Jun. 28, 1996 [JP] Japan ................................. 8-169094
Jan. 31, 1997 [JP] Japan ................................. 9-018019

[51] Int. Cl.⁷ .................................................. H05K 9/00
[52] U.S. Cl. .................... 361/818; 361/752; 361/800; 361/302; 175/35 R; 330/68; 334/85
[58] Field of Search ..................... 361/728, 736, 361/752, 796, 799, 800, 803, 816, 818, 302; 174/35 R, 51; 334/85, 74; 206/719; 439/607–610; 330/68

[56] References Cited

U.S. PATENT DOCUMENTS

| | | |
|---|---|---|
| 3,613,009 | 10/1971 | Meyer ................................. 455/178.1 |
| 3,651,409 | 3/1972 | George et al. ........................ 455/498.1 |
| 4,325,103 | 4/1982 | Ito et al. ................................. 361/816 |
| 4,697,044 | 9/1987 | Ishikawa . |
| 4,827,378 | 5/1989 | Gillan et al. . |
| 4,851,609 | 7/1989 | Reddy ................................... 174/35 R |
| 4,858,064 | 8/1989 | Segawa et al. ........................ 361/302 |
| 5,043,534 | 8/1991 | Mahulikar et al. . |
| 5,097,389 | 3/1992 | Ito et al. ................................. 361/818 |

FOREIGN PATENT DOCUMENTS

| | | |
|---|---|---|
| 189634 | 8/1992 | Taiwan . |
| 2 187 335 | 9/1987 | United Kingdom . |
| 2 270 206 | 3/1994 | United Kingdom . |

*Primary Examiner*—Jayprakash N. Gandhi
*Attorney, Agent, or Firm*—Nixon & Vanderhye P.C.

[57] ABSTRACT

The tuner structure of the present invention includes: a circuit board on which electronic circuit components such as transistors and resistors have been mounted; a chassis angle; and a shield cover. In the tuner structure, a feedthrough capacitor for inputting/outputting a power, a control signal and the like is mounted to a metal plate disposed in parallel to the circuit board.

7 Claims, 22 Drawing Sheets

FIG.16A
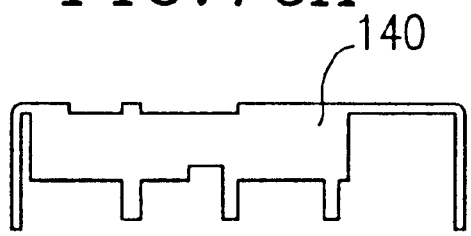
140
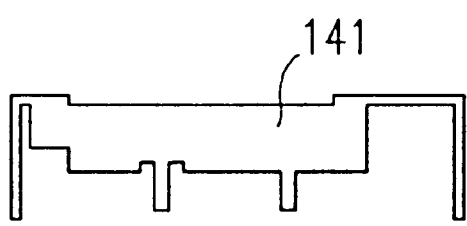
141
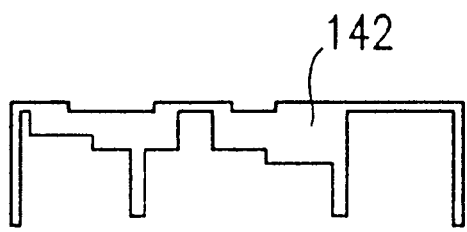
142
FIG.16B
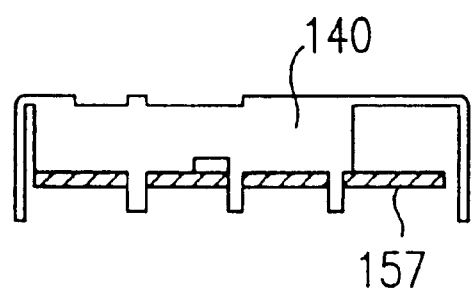
140
157
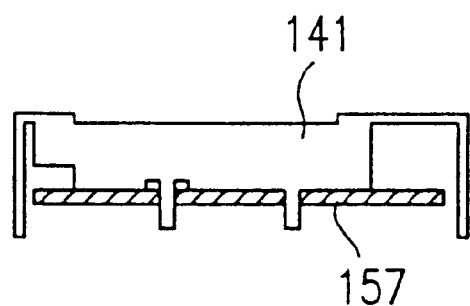
141
157
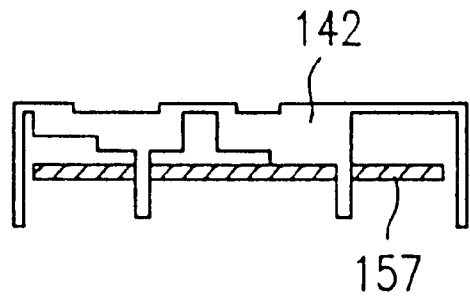
142
157

FIG. 20A *(Prior Art)*
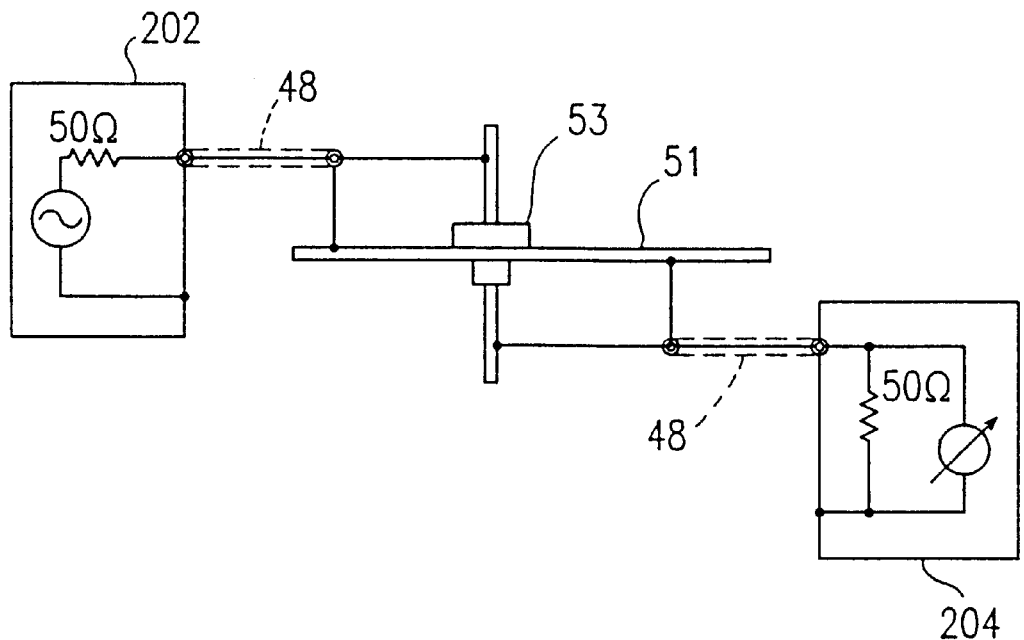
FIG. 20B *(Prior Art)*
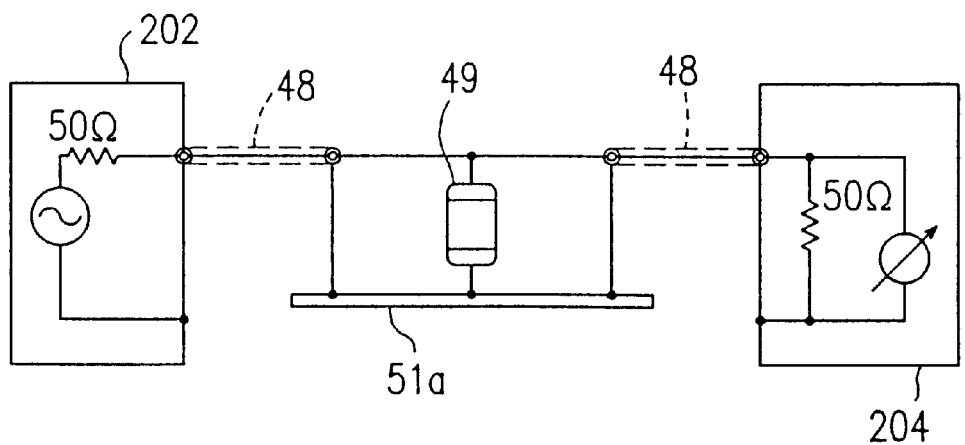

TUNER STRUCTURE AND CABLE MODEM TUNER USING THE SAME

BACKGROUND OF THE INVENTION

1. Field of the Invention

The present invention generally relates to a so-called "tuner" or a front end of a radio frequency (RF) receiver section integrated into a television transmitter/receiver or the like, and more particularly relates to a tuner structure with a reduced thickness and a cable modem tuner using the same.

2. Description of the Related Art

An exemplary conventional tuner structure is shown in FIG. 18, from which a shield cover has been omitted. As shown in FIG. 18, a circuit board 50 formed by mounting various circuit components (the respective circuit components are not shown) including resistors, capacitors, coils and transistors on a printed circuit board is incorporated into a chassis angle 51 (or the sides of a chassis disposed vertically with respect to the circuit board 50) having a folded metal plate structure. In general, a shield plate for isolating the internal circuits is also formed as an integral part of the chassis angle 51. A signal received through an antenna or the like is input through a connector 52 mounted onto a side of the chassis angle 51. In addition, terminals are also provided for supplying power, connecting control signals and retrieving output signals for the internal circuits. As the terminals, capacitor-integrated terminals of a special type called "feedthrough capacitors (or feedthrough terminals)" 53 are used.

A tuner generally has an oscillator circuit therein. As a result, radio waves leak out of the tuner through the power supply terminals thereof and the like, thereby causing unnecessary radiation. In addition, when a noise is received through the terminals of the tuner, the noise is adversely mixed into the output of the tuner so that the output signal thereof is deteriorated. The feedthrough terminals (or feedthrough capacitors) 53 are provided for dealing with these problems.

The chassis angle 51, together with the shield cover, covers the body of the tuner and provides a satisfactory ground potential having a low impedance in an RF region. The feedthrough capacitor 53 has such a cross-sectional structure as that shown in FIG. 19. In the feedthrough capacitor 53, a terminal bar 53A extends through a dielectric 54 and an inner electrode 55 inside the dielectric 54 is satisfactorily electrically conductive with the terminal bar 53A via a solder layer 56 formed around the terminal bar 53A. On the other hand, an outer electrode 57 of the dielectric 54 is satisfactorily electrically conductive with the chassis angle 51 via a solder connection 58.

FIGS. 20A and 20B respectively show a method for evaluating the grounding effects for a case of using a feedthrough capacitor 53 and a case of using a chip capacitor 49 formed as a separate component. As shown in FIGS. 20A and 20B, the measurement is performed by connecting an RF signal source 202 (having a signal source impedance of 50 Ω) to a level meter 204 (having a load impedance of 50 Ω), inserting a capacitor to be tested between a signal line and a ground therebetween, and sweeping a frequency from 0 GHz to 3 GHz. The capacitor is connected to a pair of coaxial cables 48 having an impedance of 50 Ω connected to the RF signal source 202 and the level meter 204, respectively.

FIGS. 21A and 21B respectively show the measurement results for the case of using the feedthrough capacitor 53 and the case of using the chip capacitor 49. As seen from these figures, in the case of using the feedthrough capacitor 53, more satisfactory attenuation characteristics are realized in the frequency region of about 0.5 GHz or higher. The reason is presumably as follows. Since the outer electrode 57 of the feedthrough capacitor 53 is directly connected to the chassis angle 51 of the tuner, no parasitic inductance is generated therebetween so that satisfactory grounding effects are realized.

On the other hand, in the case where a capacitor formed as a separate component (e.g., the chip capacitor 49) is provided between a terminal and a ground instead of using the feedthrough capacitor 53, the same effects as those of the feedthrough capacitor 53 can be surely attained in a low frequency region. However, since a copper case pattern inevitably exits when the electrode of the chip capacitor 49 is connected to a terminal or a ground and the capacitor 49 itself has a metal electrode pattern therein, these patterns function as parasitic inductances. As a result, in a high frequency region (e.g., 0.5 GHz or higher) where the influence of these parasitic inductances is not negligible, expected attenuation characteristics cannot be attained.

The tuner may be mounted onto a main substrate 64 either in a vertical mount fashion shown in FIGS. 22A and 22B or in a horizontal mount fashion shown in FIGS. 23A and 23B. FIG. 22A is a plan view showing a side on which an input terminal or the connector 52 has been mounted, while FIG. 22B is a plan view showing the side orthogonal to the side shown in FIG. 22A. On the other hand, FIG. 23A is a plan view showing the side on which an input terminal or the connector 52 has been mounted, while FIG. 23B is a plan view showing the side orthogonal to the side shown in FIG. 23A. The horizontal mount fashion shown in FIGS. 23A and 23B is used for a case where the space in the direction vertical to the substrate 64 on which the tuner is mounted is limited. For example, this type of mount is used for mounting a tuner onto an extended board of a personal computer.

FIG. 26 shows an exemplary internal structure of a conventional tuner structure to be mounted onto a substrate 64 in the horizontal mount fashion shown in FIGS. 23A and 23B. Chip components 60 and insert components 61 such as coils have been mounted onto a circuit board 50. A feedthrough capacitor 53 has been attached to a chassis angle 51 disposed vertically to the circuit board 50. The leg 53a of the feedthrough capacitor 53 is folded at a right angle, thereby electrically and mechanically connecting the feedthrough capacitor 53 to the main substrate 64. The outer sides of the tuner are covered with shield covers 65 and the tuner is electrically and mechanically connected to the main substrate 64 via the leg 51a of the chassis angle 51.

Next, a representative wiring process for assembling a tuner will be briefly described.

1) First, the chip components 60 and the insert components 61, such as coils which have been provisionally adhered to the circuit board 50 inside the tuner, are connected by a flow soldering method in which copper foil pattern surface of the circuit board 50 is immersed in a solder tank filled with molten solder.

2) Second, the extra line portion of a reed line of each of the insert components 61 such as coils is cut off.

3) Finally, the circuit board 50 is inserted into the chassis angle 51 to which the feedthrough capacitors 53 and the input connector 52 have been attached. Then, the circuit board 50 is connected to chassis angle 51, the terminals of the feedthrough capacitors 53 are connected to the terminal of the input connector 52 by a similar flow soldering method to that described in 1).

However, a conventional tuner structure has the following problems.

For example, in the tuner structure of the horizontal mount type shown in FIGS. 23A and 23B, since the feedthrough capacitors 53 extend from a side of the chassis angle 51, the legs 53a thereof to be used as terminals are required to be folded. In the case of employing such a tuner structure, the following disadvantages cannot be prevented.

1) Since the terminals 53a protrude from the chassis angle 51, the area of the main substrate 64 required for mounting the tuner thereon is increased.

2) The terminals 53a protruding from the chassis angle 51 are so long that the positions of the terminals 53a possibly deviate because of the contact of the terminals 53a with something during the fabrication process of the tuner, during the transportation of the tuner or during the process of mounting the tuner onto the main substrate 64. Once the positions of the terminals 53a have deviated, it becomes difficult to mount the tuner onto the main substrate 64. In order to prevent such a deviation, it is necessary to provide a member for retaining the terminals 53a, thereby partially increasing the costs.

3) When the feedthrough capacitors 53 are provided so as to protrude from a side of the chassis angle 51, an additional horizontal space should be reserved therefor. Since the space is added to the space reserved for a pawl for engaging the shield cover 65 with the chassis angle 51, the thickness of the tuner cannot be designed to be thin.

Furthermore, even if the problems about the terminals can be solved by any means, when a tuner uses a coaxial connector for connecting an input signal to the tuner, the size itself of the coaxial connector prevents the thickness of the tuner from being reduced. The size of a connector is standardized for convenience of general users. Thus, a tuner with a reduced thickness cannot be realized because of the limitation on the size of the connector. In other words, a connector of a special type having a reduced size cannot be used for reducing the thickness of a tuner.

In Japan, the United States and other countries, an input connector called an "F-type connector (or F contact tap)" is used as shown in FIG. 24. In FIG. 24, the size of the F-type connector 240 is defined as follows: the outer diameter of the threaded portion 66 is defined to be 9.4 mm$\phi$ and the outer diameter of the surface 68 to be contacted with the side of the chassis angle 51 11.0 mm$\phi$. Thus, it is difficult to obtain a tuner structure having a thickness smaller than the outer diameter of 11.0 mm$\phi$ of the surface 68 to be contacted with the side of the chassis angle 51.

FIG. 25 is a plan view of a tuner structure to which a conventional F-type connector 240 has been mounted. In FIG. 25, the reference numeral 65 denotes an upper and a lower shield cover; 53 denotes a feedthrough capacitor; and 51 denotes a chassis angle. When the thicknesses of the chassis angle 51 and the tuner are denoted by C and D, respectively, the following relationship is satisfied as shown in FIG. 25:
(Outer diameter of the surface 68 of the F-type connector 240 to be contacted with the side of chassis angle 51: 11.0 mm$\phi$)<(Thickness C of the chassis angle 51)<(Thickness D of the tuner).

For example, the thickness C and D are set at the following specific values:

C=about 12.3 mm to about 12.9 mm
D=about 14.0 mm to about 17.0 mm

The thickness C of the chassis angle 51 is designed to be larger than the outer diameter of the input connector 240 so as to secure the mounting strength of the input connector 240. Since a relatively thick coaxial cable is generally connected to the input connector 240, an input connector 240 having a weak mechanical strength is likely to deform the chassis angle 51. Furthermore, a drawing (or inflating the shield covers 65 and the like) is required to be performed so as to secure a sufficient strength for the shield covers 65 themselves and to surely engage inner shield plates (partition plates) of the chassis angle 51 with the shield covers 65 via pawls. Thus, the thickness of the tuner structure should also be increased because of the drawing and becomes rather larger than that of the input connector 240.

A conventional tuner structure and a cable modem tuner using the same have the following problems.

1) Downsizing a tuner structure

Since a cable modem is used as a peripheral component of a personal computer, such a modem is required to be downsized. However, since it is difficult to reduce the thickness of a tuner, the shape of a tuner should be modified.

2) Improving the strength of a chassis of a tuner structure

An F-type contact tap is used as an input terminal of a cable modem. When a coaxial cable is connected to the F-type contact tap, a load of 20 kg or more is applied to the F-type contact tap so that the chassis, to which the tuner input terminal is secured, is required to have a strength sufficiently strong to bear such a heavy load.

3) Improving the shielding effects of a cable modem tuner

A cable modem tuner should be connected to a cable line as a CATV appliance such that other equipment (such as a set top converter) is not affected by a spurious disturbance. Thus, as compared with a conventional TV tuner, the spurious level at the input terminal thereof should be improved.

Moreover, though a cable modem tuner to which a duplexor circuit has been integrated can bidirectionally transmit and receive data, a conventional TV tuner has no function of mixing an upstream signal and thus a duplexor circuit must be additionally provided therefor. When such a circuit is added, the filter thereof must be shielded.

Furthermore, since a cable modem tuner is a peripheral component of a personal computer, the tuner is disposed in the vicinity of the personal computer in most cases. As the cable modem is frequently exposed to digital noises generated from the personal computer, it is necessary to take some measures against the incoming disturbance signals.

SUMMARY OF THE INVENTION

According to the present invention, a tuner structure including a circuit board on which electronic circuit components such as transistors and resistors have been mounted, a chassis angle, and a shield cover is provided. In the tuner structure, a feedthrough capacitor for inputting/outputting a power, a control signal and the like is mounted to a metal plate disposed in parallel to the circuit board.

In one embodiment, the metal plate to which the feedthrough capacitor is mounted has been subjected to mechanical processing.

In another embodiment, the feedthrough capacitor is mounted to a metal ground plate provided separately from the chassis angle.

In still another embodiment, the metal ground plate has a box shape.

In still another embodiment, the chassis angle is formed by assembling a metal plate to which an input connector is mounted into another folded metal plate.

In still another embodiment, the metal plate to which the input connector is mounted has a portion having an increased width.

In still another embodiment, the metal plate to which the input connector is mounted has a plurality of small holes.

According to another aspect of the present invention, a tuner structure including a circuit board on which electronic circuit components such as transistors and resistors have been mounted, a chassis angle, and a shield cover is provided. In the tuner structure, a pin header for inputting/outputting a power, a control signal and the like is mounted to a metal plate disposed in parallel to the circuit board.

According to still another aspect of the present invention, a tuner structure including: a circuit board on which electronic circuit components such as transistors, resistors and feedthrough capacitors have been mounted; a chassis angle including a pair of shorter chassis sides, a pair of longer chassis sides and a central chassis angle plane; a shield cover; and an input connector is provided. In the tuner structure, when an outer diameter of a surface of the input connector to be contacted with one of the pair of shorter chassis sides of the chassis angle and a thickness of the chassis angle are denoted by A and B, respectively, a relationship A>B is satisfied.

In one embodiment, said one of the pair of shorter chassis sides of the chassis angle to which the input connector is mounted, is provided with ejected and drawn portions, and outwardly drawn portions around an outer circumference of a hole for inserting the input connector thereto.

In another embodiment, each of the pair of longer chassis sides of the chassis angle is provided with ejected and drawn portions and extruded pawl portions, thereby forming a mechanism for retaining the circuit board.

In still another embodiment, the tuner structure further includes a mechanism for mounting the feedthrough capacitors onto the circuit board from inside of the chassis angle.

In still another embodiment, a notched portion is provided for the shield cover so as to come into contact with one of the outwardly drawn portions of the shorter chassis side of the chassis angle to which the input connector is mounted.

In still another embodiment, the pair of shorter chassis sides, the pair of longer chassis sides and the central chassis angle plane of the chassis angle are formed by processing a single metallic flat plate.

According to still another aspect of the present invention, a cable modem tuner is provided. The cable modem tuner includes a tuner structure including: a circuit board on which electronic circuit components such as transistors, resistors and feedthrough capacitors have been mounted; a chassis angle including a pair of shorter chassis sides, a pair of longer chassis sides and a central chassis angle plane; a shield cover; and an input connector, an outer diameter A of a surface of the input connector to be contacted with one of the pair of shorter chassis sides of the chassis angle being larger than a thickness B of the chassis angle. The cable modem tuner further includes: radio frequency amplifier input tuner circuits corresponding to respectively different frequency bands; radio frequency amplifiers; radio frequency amplifier output tuner circuits; frequency converter circuits; local oscillator circuits; an intermediate frequency amplifier circuit; an SAW filter circuit; an intermediate frequency amplifier circuit as a post stage amplifier circuit; and PLL selector circuits.

Thus, the invention described herein makes possible the advantages of (1) providing a tuner structure having a reduced thickness and occupying a smaller area on a main substrate when the tuner structure is mounted thereon and (2) providing a cable modem tuner using the same.

These and other advantages of the present invention will become apparent to those skilled in the art upon reading and understanding the following detailed description with reference to the accompanying figures.

BRIEF DESCRIPTION OF THE DRAWINGS

FIG. 4A is a perspective view of a metal ground plate 12 to which the feedthrough capacitors 4 are attached; and FIG. 4B is a schematic cross-sectional view of the tuner structure to which the metal ground plate 12 has been incorporated.

FIG. 6A is a perspective view of a box-shaped metal ground plate 14 to which the feedthrough capacitors 4 are attached; and FIG. 6B is a schematic cross-sectional view of the tuner structure to which the box-shaped metal ground plate 14 has been incorporated.

FIG. 8A is a perspective view of a metal plate 20 for mounting the input connector thereto, for which plate a hole 21 for mounting the input connector therethrough, holes 22 for engaging the plate 20 with the chassis angle 18 and a plurality of solder-absorbing holes (small holes) 23 have been provided; and FIG. 8B is a schematic perspective view of the tuner structure to which the metal plate 20 has been attached.

FIG. 9A is a perspective view of the pin header 25; and FIG. 9B is a schematic cross-sectional view of the tuner structure using the pin header 25.

FIG. 10A is a plan view of the tuner structure; FIG. 10B is a side view of a longer side thereof; and FIG. 10C is a side view of a shorter side thereof.

FIG. 11A is a side view of a shorter chassis side 111; FIG. 11B is a plan view of the folded chassis angle or a central chassis angle plane 115; FIG. 11C is a side view of a longer chassis side 113; and FIG. 11D is a side view of a shorter chassis side 112.

FIG. 13A is a plan view viewed from the longer chassis side 113; FIG. 13B is a cross-sectional view thereof; and FIG. 13C is a plan view thereof.

FIG. 14A is a side cross-sectional view showing a structure for mounting the F-type connector; FIG. 14B is a vertical cross-sectional view illustrating the caulking of the F-type connector; and FIG. 14C is a partial enlarged view of FIG. 14B.

FIGS. 16A and 16B are side views illustrating various shapes of partition plates to be provided onto the central chassis angle plane 115 during the assembly of the tuner structure in the tenth example of the present invention: FIG. 16A are side views showing only the shapes of the partition plates; and FIG. 16B are side views illustrating the positional relationships between the circuit board and the partition plates in various shapes.

FIG. 17A is a block diagram of an electric circuit components formed in the cable modem tuner; and FIG. 17B is a plan view showing the arrangement of the respective electric circuit components shown in FIG. 17A in the tuner structure.

FIGS. 20A and 20B are respective schematic representations showing a method for evaluating the grounding effects for a case of using a feedthrough capacitor and a case of using a chip capacitor formed as a separate component.

FIG. 22A is a plan view showing a side, to which an input terminal has been attached, of a tuner structure to be mounted onto the main substrate in a vertical mount fashion; and FIG. 22B is a plan view showing the side orthogonal to the side shown in FIG. 22A.

FIG. 23A is a plan view showing a side, to which an input terminal has been attached, of a tuner structure to be mounted onto the main substrate in a horizontal mount fashion; and FIG. 23B is a plan view showing the side orthogonal to the side shown in FIG. 23A.

DESCRIPTION OF THE PREFERRED EMBODIMENTS

Hereinafter, the present invention will be described by way of illustrative examples with reference to the accompanying drawings.

EXAMPLE 1

Figure 1:
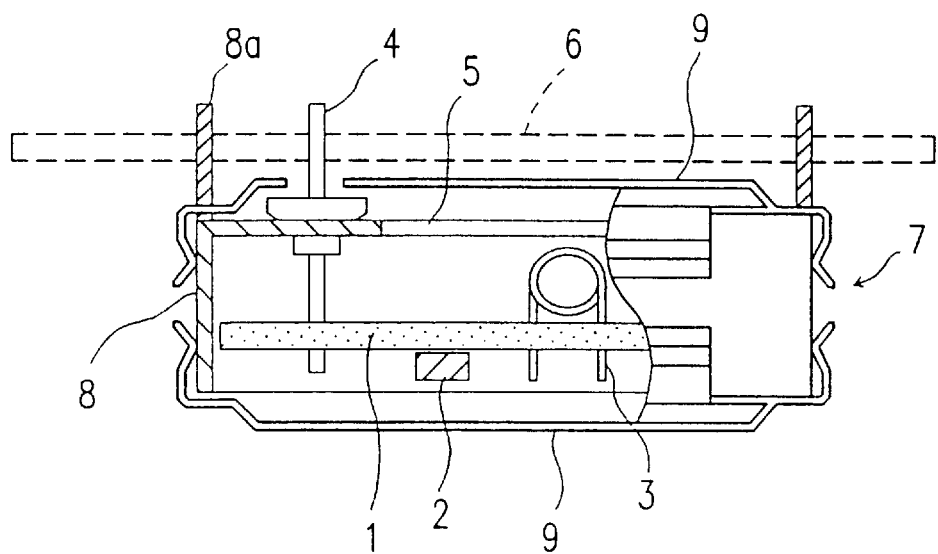
FIG. 1 is a schematic cross-sectional view of a tuner structure using a feedthrough capacitor in a first example of the present invention.

FIG. 1 is a schematic cross-sectional view showing the internal structure of a tuner structure using a feedthrough capacitor in a first example of the present invention. Chip components 2 and insert components 3 such as coils have been mounted onto a circuit board 1. A feedthrough capacitor 4 is vertically mounted through the circuit board 1 and is mounted through a metal plate 5 disposed in parallel to the circuit board 1 so as to extend through the circuit board 1 and the metal plate 5 to reach a main substrate 6. On the other hand, the body 7 of the tuner is electrically and mechanically connected to the main substrate 6 via legs 8a of a chassis angle 8. An upper and lower shield cover 9 are secured to the outer surfaces of the tuner. Since a feedthrough capacitor 4 is used, a tuner having satisfactory RF characteristics and a reduced thickness can be realized.

EXAMPLE 2

Figure 2:
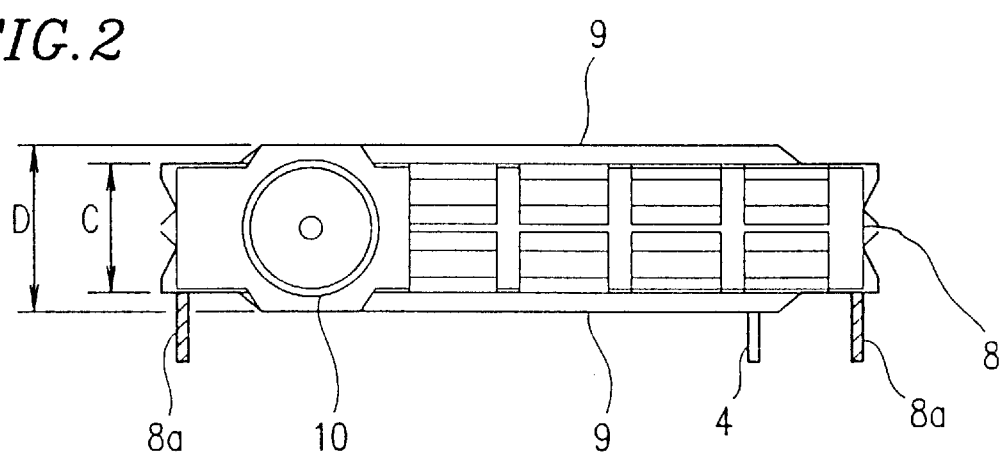
FIG. 2 is a plan view showing a side of a tuner structure using a feedthrough capacitor in a second example of the present invention, to which side an input connector has been mounted.

FIG. 2 is a plan view showing a side, to which an input connector has been mounted, of a tuner structure using an F-type connector. In FIG. 2, the reference numeral 10 denotes the input (F-type) connector; 9 denotes shield covers; 4 denotes a feedthrough capacitor; 8 denotes a chassis angle; and 8a denotes legs of the chassis angle 8. When the thicknesses of the chassis angle 8 and the tuner are denoted by C and D, respectively, the following relationship is satisfied as shown in FIG. 2:

(Thickness C of the chassis angle 8)<(Thickness D of tuner)

For example, the thickness C and D are set at the following specific values:

C=about 8.9 mm to about 9.5 mm

D<about 11.5 mm

Thus, the thickness C of the chassis angle 8 is smaller than the diameter of a surface of the F-type connector 10 (11.0 mm) to be contacted with the chassis angle 8.

EXAMPLE 3

Figure 3:
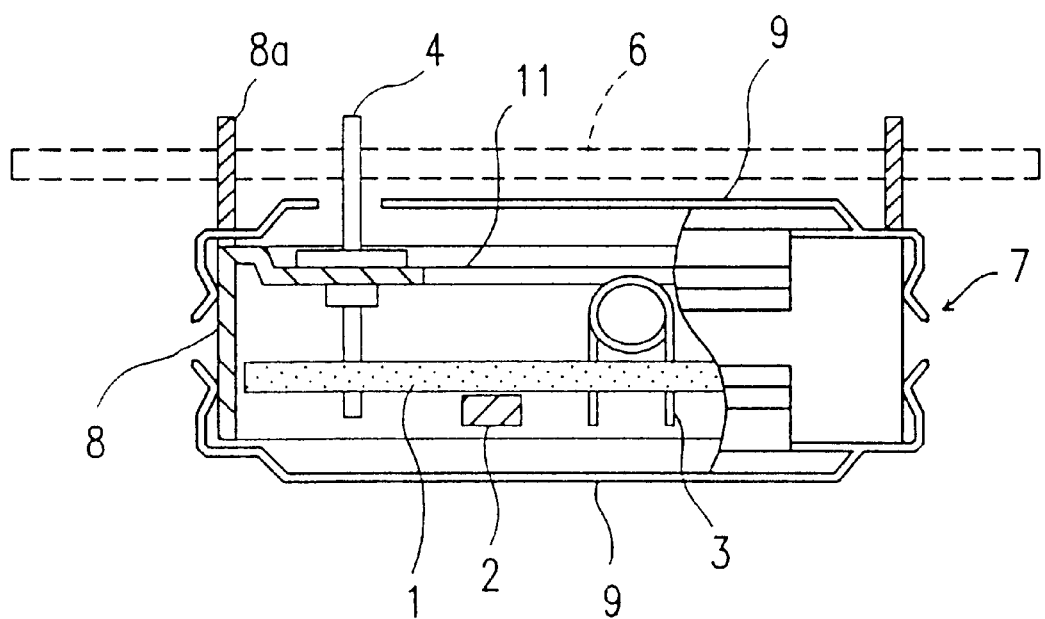
FIG. 3 is a schematic cross-sectional view of a tuner structure in a third example of the present invention, in which the feedthrough capacitor 4 is attached to a mechanically processed and inwardly concave metal plate.

FIG. 3 is a schematic cross-sectional view showing the internal structure of a tuner structure using a feedthrough capacitor in a third example of the present invention. The third example is different from the first example shown in FIG. 1 in that a metal plate 11 is formed by (mechanically) processing the metal plate 5 through which the feedthrough capacitor 4 is mounted such that the metal plate 11 becomes inwardly (i.e., toward the surface of the circuit board 1 which the metal plate 11 faces) concave. As shown in FIG. 3, chip components 2 and insert components 3 such as coils have been mounted onto a circuit board 1. A feedthrough capacitor 4 is vertically mounted through the circuit board 1 and is mounted through the metal plate 11 disposed in parallel and inwardly concave with respect to the circuit board 1 so as to extend through the circuit board 1 and the metal plate 11 to reach a main substrate 6. On the other hand, the body 7 of the tuner is electrically and mechanically connected to the main substrate 6 via legs 8a of a chassis angle 8. An upper and lower shield cover 9 are secured to the outer surfaces of the tuner. Since a feedthrough capacitor 4 is used, a tuner having satisfactory RF characteristics and a further reduced thickness can be realized.

Specifically, the metal plate 11 is made inwardly concave by about 1 mm to about 2 mm, thereby improving the mechanical strength of the plate 11 and further reducing the distance between the upper and the lower shield covers 9 or the thickness of the tuner.

EXAMPLE 4

Figure 4A:
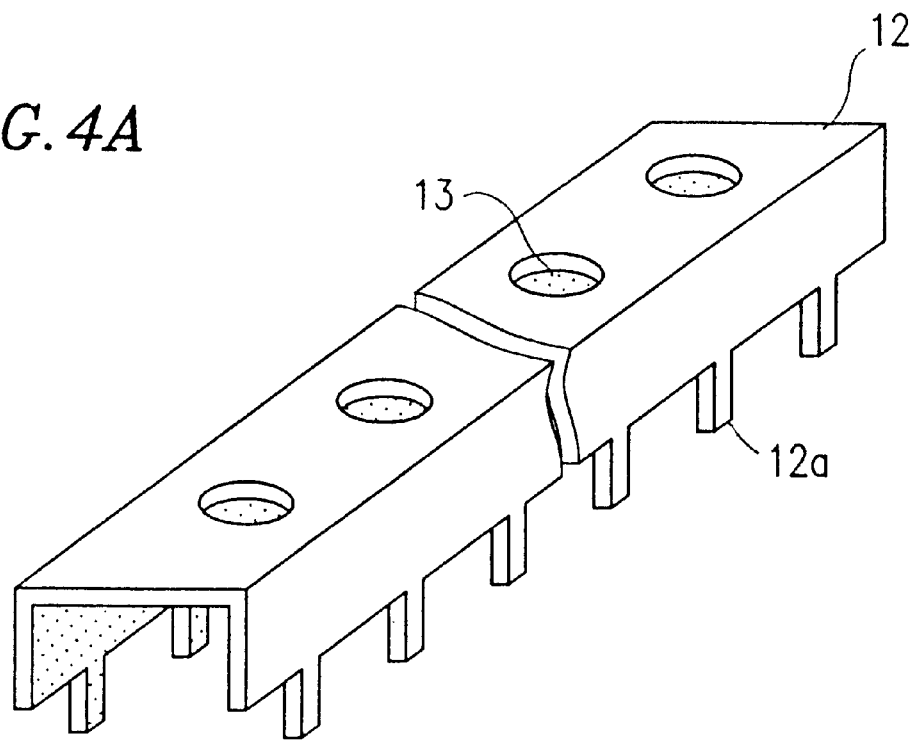
FIGS. 4A and 4B are views for illustrating a tuner structure in a fourth example of the present invention.
Figure 4B:
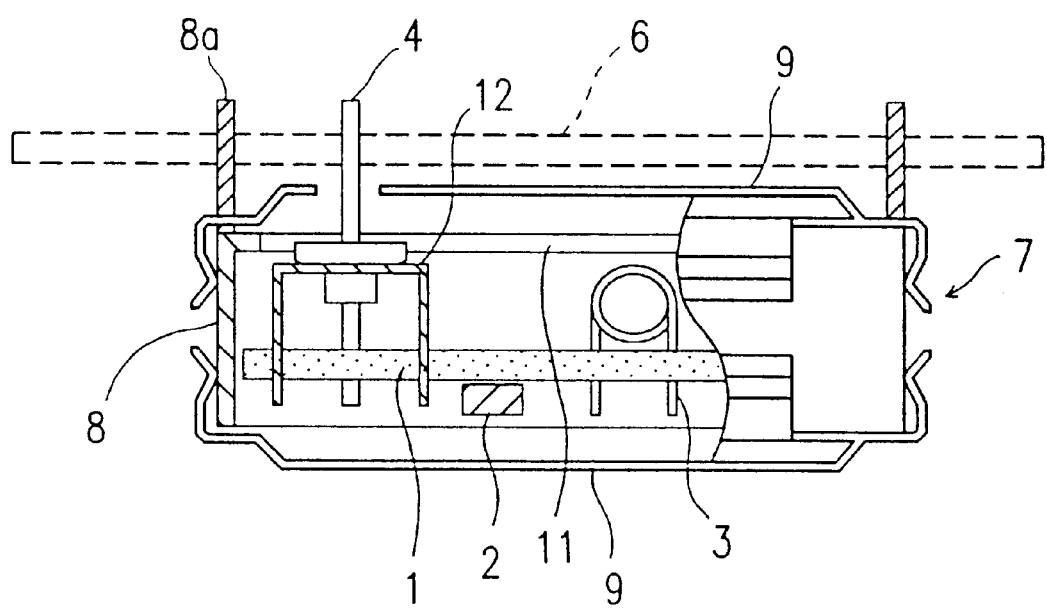

FIGS. 4A and 4B show a tuner structure in a fourth example of the present invention. Though the feedthrough capacitor 4 is mounted on the metal plate 11 mechanically processed to be inwardly concave in the third example shown FIG. 3, a metal ground plate 12 is separately provided in this fourth example. FIG. 4A is a perspective view of such a metal ground plate 12 to which the feedthrough capacitors 4 are mounted. The metal ground plate 12 is electrically and mechanically connected to the circuit board 1 via legs 12a of the metal ground plate 12. The reference numeral 13 denotes insertion holes into which the feedthrough capacitors 4 are inserted and mounted. The metal ground plate 12 is electrically connected to the chassis angle 8 via the wires of the circuit board 1.

FIG. 4B is a schematic cross-sectional view of the tuner structure to which the metal ground plate 12 has been incorporated. As shown in FIG. 4B, chip components 2 and insert components 3 such as coils have been mounted to the circuit board 1. The feedthrough capacitor 4 is vertically mounted through the circuit board 1 and the metal ground plate 12 is disposed in parallel to the circuit board 1. The feedthrough capacitor 4 is inserted into the insertion hole 13 of the metal ground plate 12 and one end of the feedthrough capacitor 4 reaches the main substrate 6 so as to be electrically and mechanically connected to the main substrate 6. On the other hand, the body 7 of the tuner is electrically and mechanically connected to the main substrate 6 via legs 8a of a chassis angle 8. An upper and lower shield cover 9 are secured to the outer surfaces of the tuner. Since a feedthrough capacitor 4 is used, a tuner having satisfactory RF characteristics and a further reduced thickness can be realized. In this example, since the ground of the circuits (on the circuit board 1) is directly connected to the feedthrough capacitors 4, a parasitic inductance to be generated can be reduced so that the attenuation is improved.

EXAMPLE 5

Figure 5:
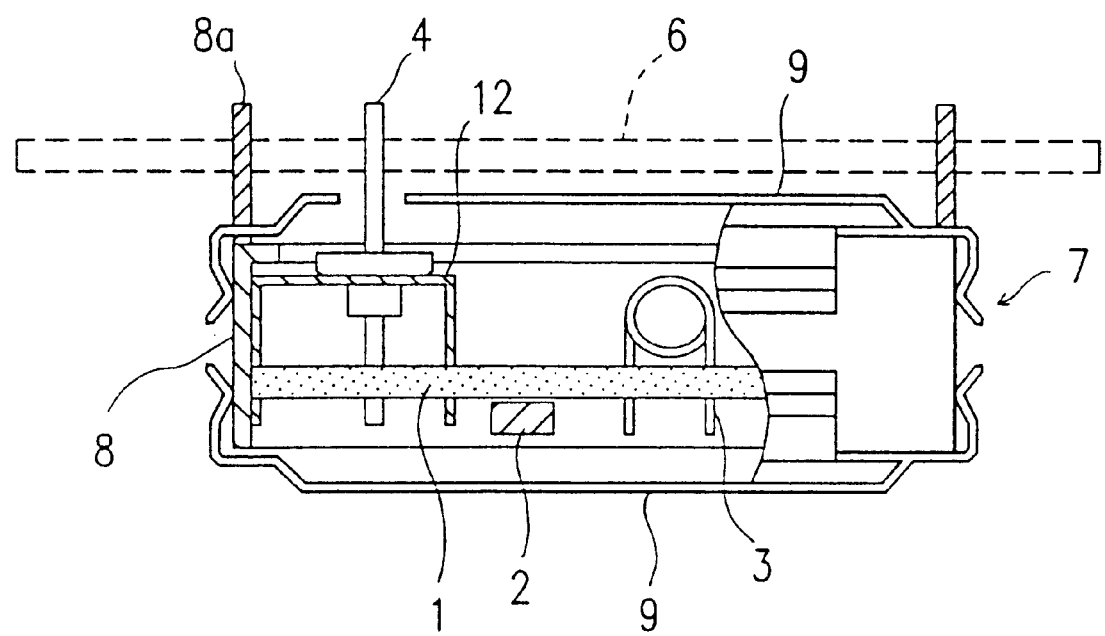
FIG. 5 is a schematic cross-sectional view of a tuner structure in a fifth example of the present invention, in which the metal ground plate 12 has been disposed in contact with the chassis angle 8.

FIG. 5 shows a tuner structure in a fifth example of the present invention, which is a variant of the example shown in FIGS. 4A and 4B. In this fifth example, the metal ground plate 12 is electrically and mechanically connected to the circuit board 1 and is provided so as to be in contact with the chassis angle 8. Such a structure not only increases the mechanical strength of the plate 12 but also secures a more satisfactory ground potential more easily and a low impedance in an RF region. In FIG. 5, the reference numeral 1 denotes a circuit board; 2 denotes chip components; 3 denotes insert components such as coils; 4 denotes a feedthrough capacitor; 6 denotes a main substrate; 8 denotes a chassis angle; and 9 denotes an upper and a low shield cover. The metal ground plate 12 to which the feedthrough capacitor 4 is mounted is disposed in parallel to the circuit board 1. Since a feedthrough capacitor 4 is used, a tuner having satisfactory RF characteristics and a further reduced thickness can be realized. In this example, since the metal ground plate 12 is in contact with the chassis angle 8, the ground of the main substrate 6 is satisfactorily in contact with the ground of the circuit board 1 via the legs 8a of the chassis angle 8 so that the parasitic inductance is reduced.

EXAMPLE 6

Figure 6A:
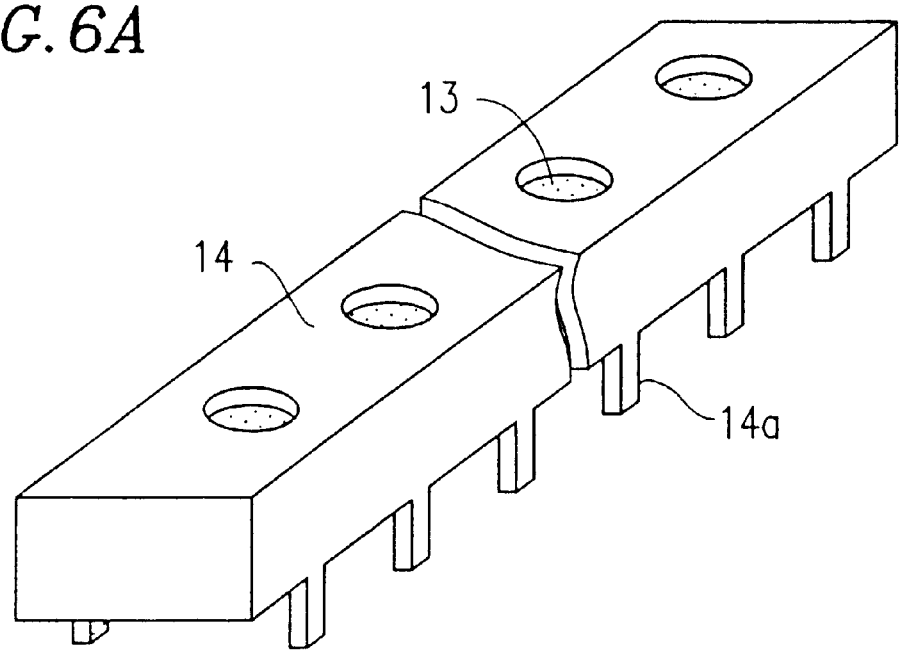
FIGS. 6A and 6B are views for illustrating a tuner structure in a sixth example of the present invention.
Figure 6B:
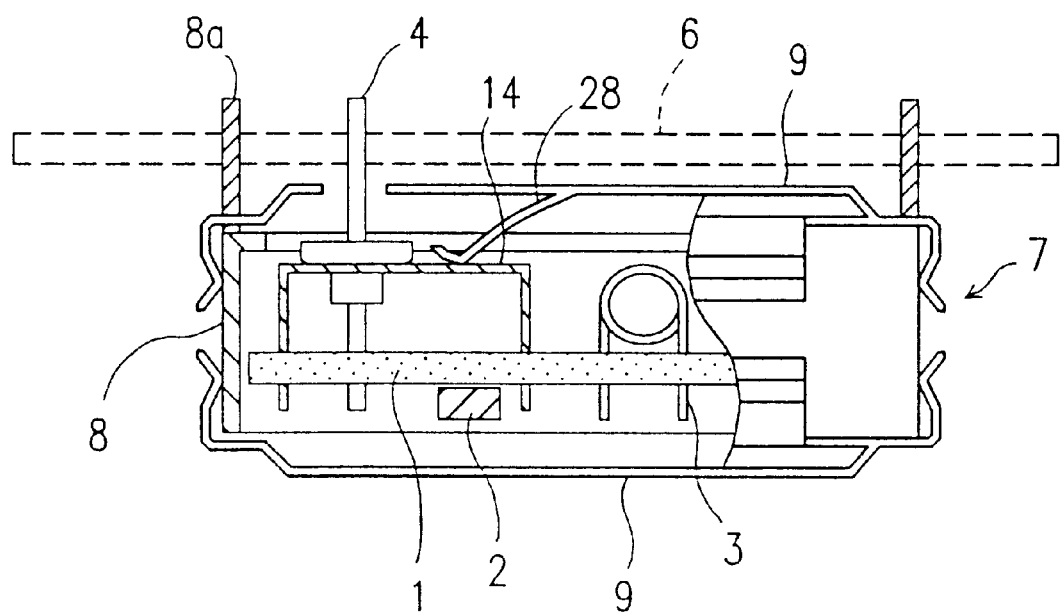

FIGS. 6A and 6B show a tuner structure in a sixth example of the present invention. Though the feedthrough capacitor 4 is mounted on a separately provided metal ground plate 12 in the fourth example shown in FIGS. 4A and 4B, the metal ground plate 12 is formed in a box shape in this sixth example (hereinafter, such a metal ground plate will be referred to as a box-shaped metal ground plate 14). FIG. 6A is a perspective view of such a box-shaped metal ground plate 14 to which the feedthrough capacitors 4 are mounted. The metal ground plate 14 is electrically and mechanically connected to the circuit board 1 via legs 14a of the box-shaped metal ground plate 14. The reference numeral 13 denotes insertion holes to which the feedthrough capacitors 4 are inserted and mounted. The box-shaped metal ground plate 14 is electrically connected to the chassis angle 8 via the wires of the circuit board 1.

FIG. 6B is a schematic cross-sectional view of the tuner structure to which the box-shaped metal ground plate 14 has been incorporated. As shown in FIG. 6B, chip components 2 and insert components 3 such as coils have been mounted onto the circuit board 1. The feedthrough capacitor 4 is vertically mounted through the circuit board 1 and the box-shaped metal ground plate 14 is disposed in parallel to the circuit board 1. The feedthrough capacitor 4 is inserted into a corresponding insertion hole 13 of the box-shaped metal ground plate 14 and one end of the feedthrough capacitor 4 reaches the main substrate 6 so as to be electrically and mechanically connected to the main substrate 6. On the other hand, the body 7 of the tuner is electrically and mechanically connected to the main substrate 6 via legs 8a of a chassis angle 8. An upper and lower shield cover 9 are secured to the outer surfaces of the tuner. Since the metal ground plate 14 has a box shape, various components can be disposed inside the box-shaped metal ground plate 14. Thus, the box-shaped metal ground plate 14 can also function as a shield case. In addition, as shown in FIG. 6B, a pawl 28 is provided for the upper shield cover 9 such that the pawl 28 comes into strong contact with the box-shaped metal ground plate 14 by means of the spring pressure of the shield cover 9. As a result, the grounding effects of the metal ground plate 14 can be enhanced. Since a feedthrough capacitor 4 is used, a tuner having satisfactory RF characteristics and a further reduced thickness can be realized. In this example, the components inside with the shield case or the box-shaped metal ground plate 14 can be sealed therein. Thus, even when an oscillator is provided therein, the radiation waves thereof do not leak out of the tuner.

EXAMPLE 7

Figure 7:
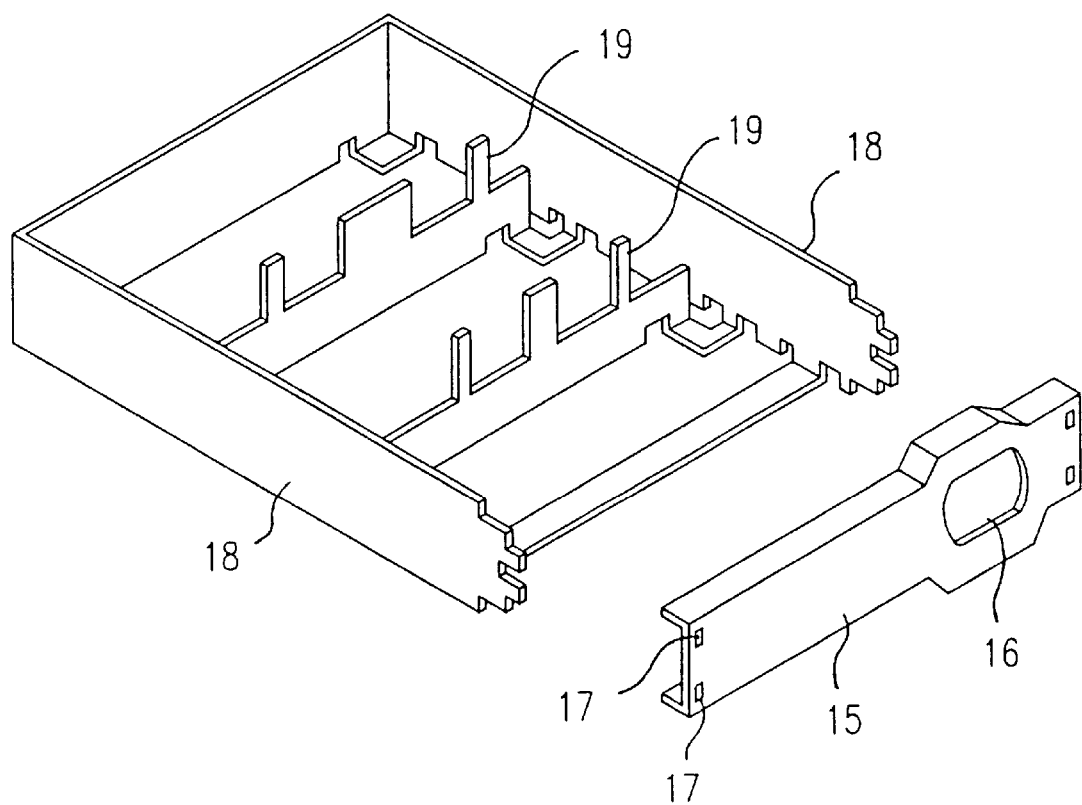
FIG. 7 is an exploded perspective view of a chassis angle which is used for a tuner structure in a seventh example of the present invention and has been designed in view of the size limitation given by a coaxial connector or the input connector upon the chassis angle.

FIG. 7 shows a tuner structure in a seventh example of the present invention which has been designed in view of the limitations given by the size of a coaxial connector. More specifically, in this seventh example, a side 15 to which an input connector is mounted is removed (or separately formed) from a chassis angle 18 in order to reduce the thickness of the chassis angle and thereby reduce the total thickness of the tuner. That is to say, the tuner structure of the seventh example has a structure in which the chassis angle is obtained by assembling a metal plate 15 to which the input connector is mounted into the other parts of the chassis angle 18. In addition, the metal plate 15 to which the input connector is mounted has a portion with an increased width.

However, the mechanical strength of the assembled chassis angle cannot be sufficiently retained once the input connector is attached to the metal plate 15. The upper and lower end portions of the metal plate 15, to which the input connector is mounted, are provided with folded portions formed by a drawing. When the metal plate 15 for mounting the input connector thereto is provided separately from the chassis angle 18 in this way, the following advantages can be attained: the material and the thickness of the chassis angle can be arbitrarily selected; an arbitrary drawing can be performed at a desired folding size; the input connector can be mounted onto an arbitrary position on the metal plate 15; the flexibility in design is greater; and an optimum metal plate can be used as the metal plate 15 for mounting the input connector thereon. In this example, the metal plate 15 for mounting the input connector thereto is made of a tin-plated steel plate having a thickness of about 0.6 mm.

As shown in FIG. 7, a metal processed plate or the metal plate 15 for mounting the input connector thereto is provided. The metal plate 15 has a hole 16 through which the input connector is mounted and holes 17 through which the metal plate 15 is engaged with and assembled onto the chassis angle 18. The metal plate 15 is assembled with the chassis angle 18 via the holes 17, thereby forming a chassis case. In FIG. 7, the reference numeral 19 denotes partition plates for improving the shielding effects. When the chassis case is assembled, the appearance thereof becomes the same as that shown in FIG. 2.

EXAMPLE 8

Figure 8A:
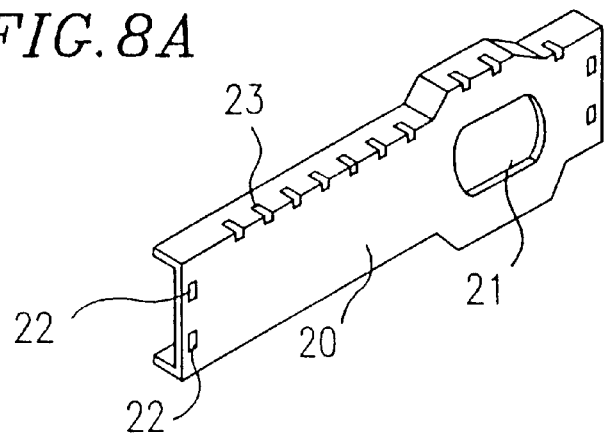
FIGS. 8A and 8B are views for illustrating a tuner structure in an eighth example of the present invention.
Figure 8B:
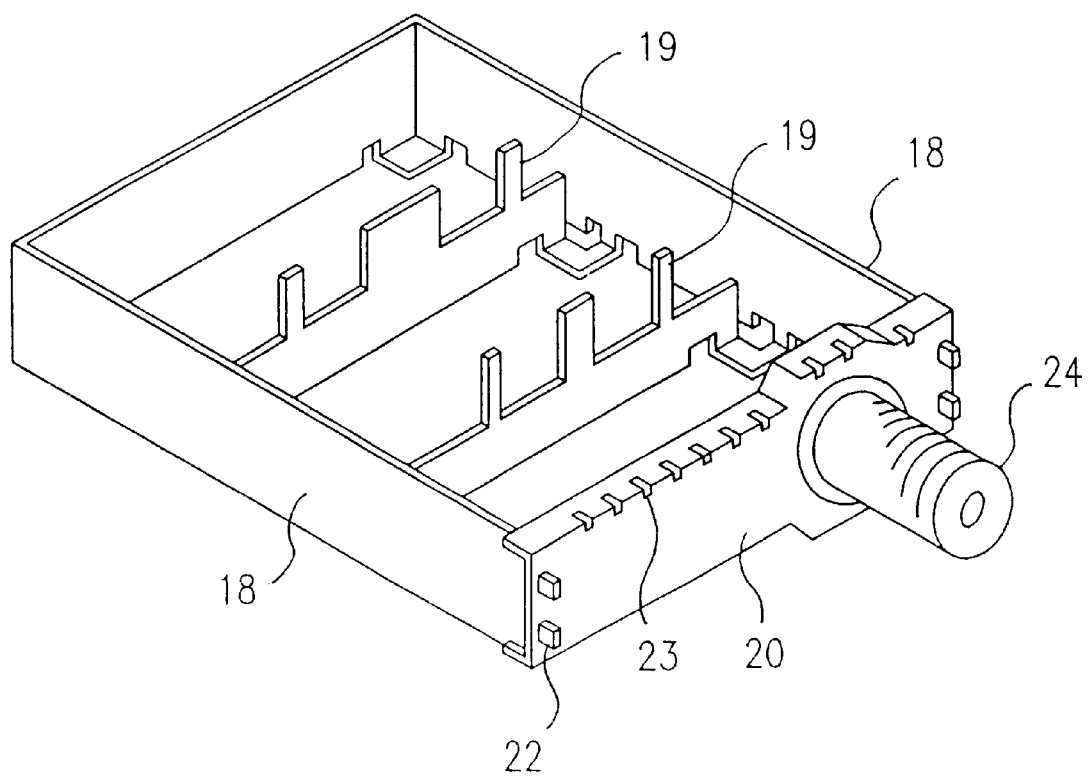

FIGS. 8A and 8B show a tuner structure in an eighth example of the present invention, which is a variant of the example shown in FIG. 7. As shown in FIG. 8A, a metal plate 20 for mounting the input connector thereon is provided not only with a hole 21 through which the input connector is mounted and holes 22 through which the plate 20 is engaged with the chassis angle 18, but also with multiple small holes 23 for absorbing solder therethrough (hereinafter, such holes will be referred to as "solder-absorbing holes"). The solder-absorbing holes 23 are often provided on the side of the metal plate 20 which is to be dipped in solder. A chassis case is formed by assembling the metal plate 20 into the chassis angle 18. In FIG. 8B, the reference numeral 19 denotes partition plates for improving the shielding effects. By providing the multiple small holes 23 for one of the drawn sides of the metal plate 20 which is to be dipped in solder, the external size of the metal plate 20 can be prevented from being unsuitable since the solder does not collect on the metal plate 20 but is absorbed through the holes 23.

FIG. 8B is a perspective view of the chassis case to which the input connector has been mounted. In Japan, the United States and other countries, a so-called "F-type" input connector is used. The F-type input connector has a threaded portion on the outer circumference thereof. The threaded portion is usually fastened to and secured with the chassis of a tuner-integrated receiver via a nut. In FIG. 8B, a chassis case is formed by assembling the metal plate 20 into the chassis angle 18. In FIG. 8B, the reference numeral 19 denotes partition plates for improving the shielding effects and 24 denotes an input connector (e.g., an F-type input connector).

As shown in FIG. 8B, the metal plate 20 for mounting the input connector thereto has many folded portions. When a tuner is assembled, the metal plate 20 is subjected to a flow solder process step. In general, the solder is likely to collect on and be adhered to the folded portions during this process step. As a result, the thickness of the tuner case is increased because of the adhered solder and the size precision of the tuner case often cannot be kept. However, since the multiple solder-absorbing holes 23 are provided for the folded portions of the metal plate 20 for mounting the input connector thereto, the solder is absorbed therethrough and the size precision of the tuner case can be maintained.

Moreover, the width of the portion of the metal plate 20 for mounting the input connector thereto is required to be a little larger than the size of the nut used for fastening the input connector 24. The reason is as follows. The torque generated when the input connector 24 is fastened with the nut or when the input connector 24 is fastened with an antenna cable connector is large. Thus, the chassis angle is likely to be deformed if the width of the chassis angle of the tuner is decreased and the margin size of the chassis angle except for the size of the input connector is small.

EXAMPLE 9

Figure 9A:
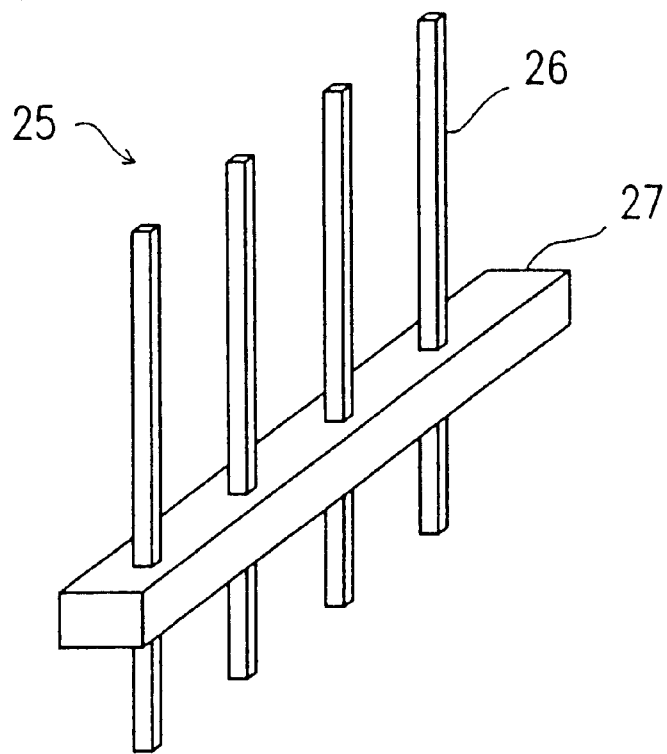
FIGS. 9A and 9B are views for illustrating a tuner structure using a pin header in a ninth example of the present invention.
Figure 9B:
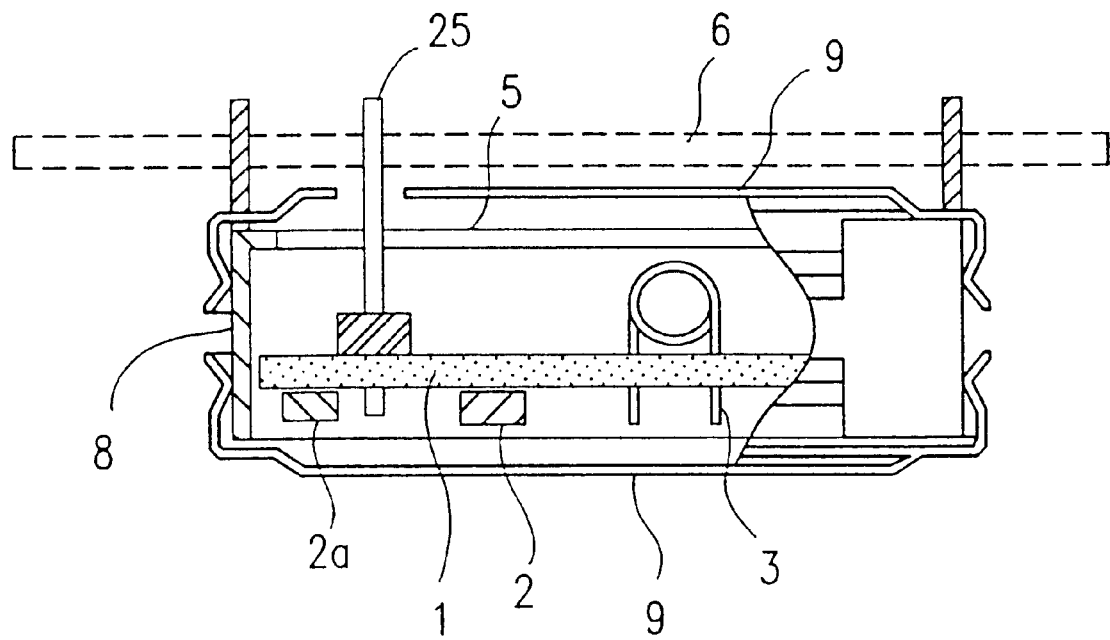

FIGS. 9A and 9B show a tuner structure in a ninth example of the present invention, showing an implementation for realizing a tuner with a reduced thickness in which a commonly used terminal called a "pin header" having no capacitor function is provided instead of a feedthrough capacitor. FIG. 9A is a perspective view of the pin header 25 in which header pins 26 are held by a holding member 27 made of a resin via a predetermined gap therebetween. FIG. 9B is a schematic cross-sectional view of a tuner structure using the pin header 25.

In the tuner structure of the ninth example of the present invention shown in FIG. 9B, chip components 2, a chip capacitor 2a and insert components 3 such as coils have been mounted onto a circuit board 1. The pin header 25 is disposed vertically with respect to the circuit board 1 and extends through the metal plate 5 disposed in parallel to the circuit board 1 to be directly mounted onto the main substrate 6. Moreover, the tuner is electrically and mechanically connected to the main substrate 6 via the legs 8a of the chassis angle 8. The reference numeral 9 denotes shield covers.

The ninth example using the pin header 25 can eliminate conventional mechanical disadvantages. However, even when a capacitor is connected between a terminal and a ground, the electrical performance of the pin header 25 is inferior to that of a feedthrough capacitor in respect of the radio frequency characteristics. More specifically, an RF signal is more likely to leak from the terminal and the ability of the pin header 25 for preventing the external disturbance is inferior to that of a feedthrough capacitor. Thus, such a pin header 25 is used for a tuner applicable to a particular frequency.

EXAMPLE 10

Figure 12:
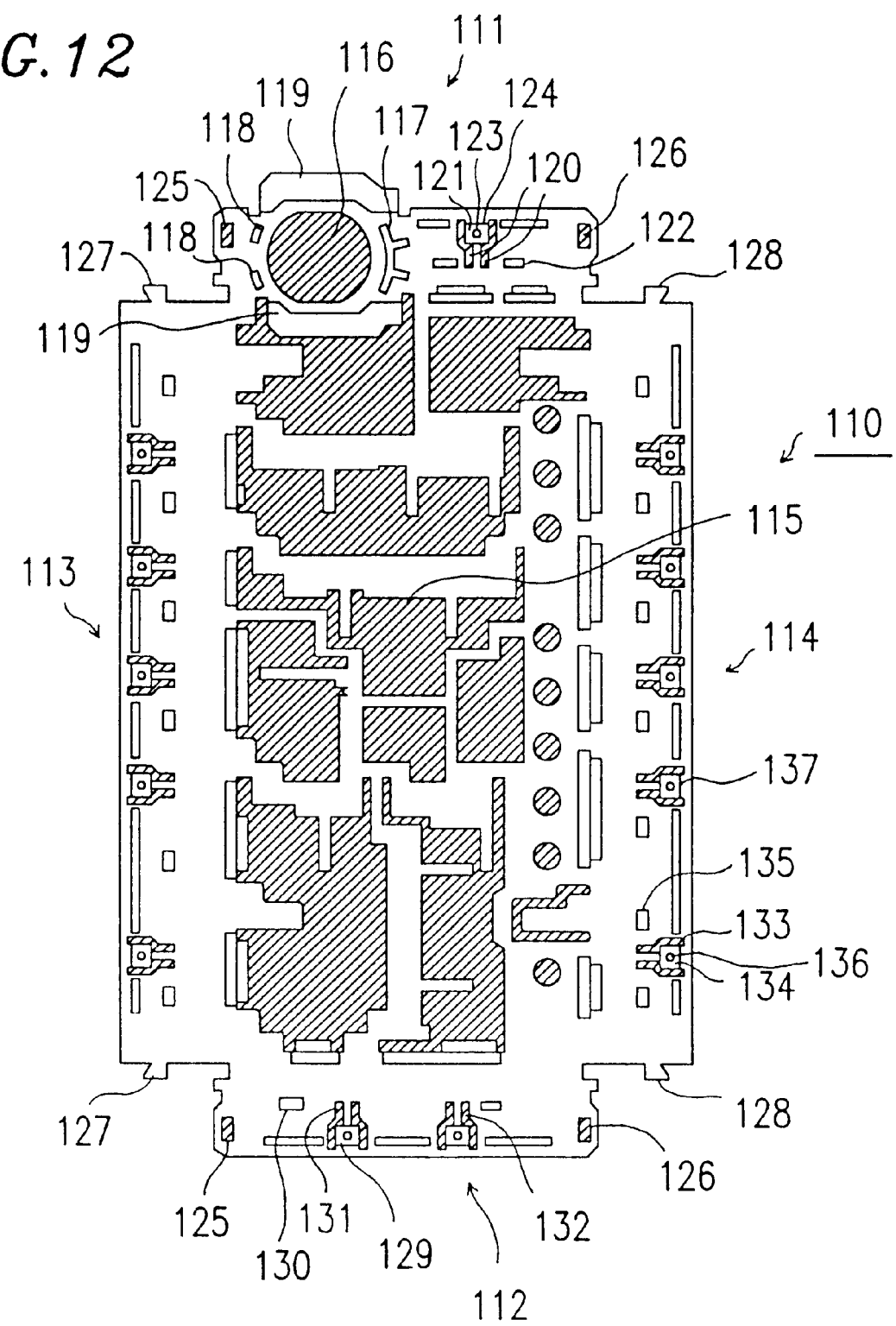
FIG. 12 is a plan view of an unfolded chassis angle of the tuner structure in the tenth example of the present invention.

FIG. 12 is a plan view of an unfolded chassis angle of a tuner structure in a tenth example of the present invention. As shown in FIG. 12, a single metal plate 110 for a chassis case includes the five regions of: two shorter chassis sides 111 and 112; two longer chassis sides 113 and 114; and a central chassis angle plane 115. In FIG. 12, the hatched regions are regions to be stamped by a press working. A rectangular parallelepiped tuner structure of the present invention is formed from the single metal plate 110 for a chassis case by subjecting a single metallic flat plate (having a thickness of about 0.6 mm) to various kinds of processing such as press working, drawing, ejection drawing and bending.

The shorter chassis side 111 will be described. The shorter chassis side 111 is a side to which an input connector is mounted. In FIG. 12, the reference numeral 116 denotes a hole into which the input connector (an F-type connector or an F contact tap) is inserted and 117 and 118 denote ejected and drawn portions which have been processed so as to downwardly protrude from the plane of the shorter chassis side 111 (i.e., to vertically and downwardly protrude from the paper sheet). If these portions 117 and 118 are ejected and drawn so as to upwardly protrude from the plane of the shorter chassis side 111 (i.e., to vertically and upwardly protrude from the paper sheet), when an F-type connector is fastened by gripping the annuli of the connector, then the portions 117 and 118 come into contact with a fastening jig so that the fastening cannot be performed satisfactorily. In order to avoid such a situation, these portions 117 and 118 are made to downwardly protrude from the shorter chassis side 111. Also, these ejected and drawn portions 117 and 118 are formed in circular shapes around the hole 116 for inserting the input connector thereto, thereby increasing the mechanical strength thereof. Furthermore, the circular ejected and drawn portion 117 is formed in a π shape from which two corners protrude, thereby further increasing the mechanical strength thereof. Though the ejected and drawn portions 118 are formed in a short circular shape because the space thereof is limited, these portions 118 may also be formed in a similar π shape to that of the portion 117.

A pair of portions 119 provided above and below the outer circumference of the hole 116 for inserting the F-type connector thereto are outwardly drawn portions which are to be bent so as to vertically and downwardly protrude from the paper sheet and are to be subjected to a drawing on the shoulder portions thereof. As will be described later, the mechanical strength of the chassis angle is increased by providing the outwardly drawn portions 119 and the ejected and drawn portions 117 and 118.

A pair of stamped portions 120 and an extruded pawl portion 121 which are provided on the right side of the hole 116 for inserting the F-type connector thereto, together with a pair of extruded and drawn portions 122 provided on both sides of the extruded pawl portion 121, serve to retain a circuit board. A navel-shaped protruding portion 123 (about 0.8 mmφ) provided at the center of the extruded pawl portion 121 serves to suppress the flow of solder. A stamped line 124 provided on the upper side of the extruded pawl potion 121 is a line stamped by a mold having a clearance of substantially zero.

Furthermore, a pair of stamped portions 125 and 126 in the left and right end portions of the shorter chassis side 111 are provided to be respectively engaged with a pair of engageable protruding portions 127 and 128 of the longer chassis sides 113 and 114, respectively, during the assembly of the tuner structure and to form a rectangular parallelepiped tuner structure by a twisting. On the other hand, the other shorter chassis side 112 includes: two extruded pawl portions 129; two extruded and drawn portion 130; and two pairs of stamped portions 131 and 132. All of these portions function in the same way as the counterparts of the shorter chassis side 111.

Next, the longer chassis side 114 will be described. The longer chassis side 114 not only becomes a part of the shield case but also retains the circuit board because the longer chassis side 114 is provided with extruded pawl portions and extruded and drawn portions for retaining the circuit board. As shown in FIG. 12, stamped portions 133, an extruded pawl portion 134 and a pair of extruded and drawn portions 135, which are provided on both sides of the extruded pawl portion 134, serve to retain the circuit board. A navel-shaped protruding portion 136 (about 0.8 mmφ) provided at the center of the extruded pawl portion 134 serves to suppress the flow of solder. A stamped line 137 on the upper side of the extruded pawl potion 134 is a line stamped by a mold having a clearance of substantially zero. The function of the longer chassis side 114 for retaining the circuit board will be described in detail later with reference to FIGS. 13A to 13C.

Next, the central chassis angle plane 115 will be described. The central chassis angle plane 115 includes: nine holes for inserting feedthrough capacitors thereto; three partition plates disposed in parallel to the shorter chassis sides 111 and 112; and a partition plate disposed vertically to the shorter chassis sides 111 and 112. These portions will be described in detail with reference to FIGS. 11A to 11D, 15, 16A and 16B and 17A and 17B.

Figure 10A:
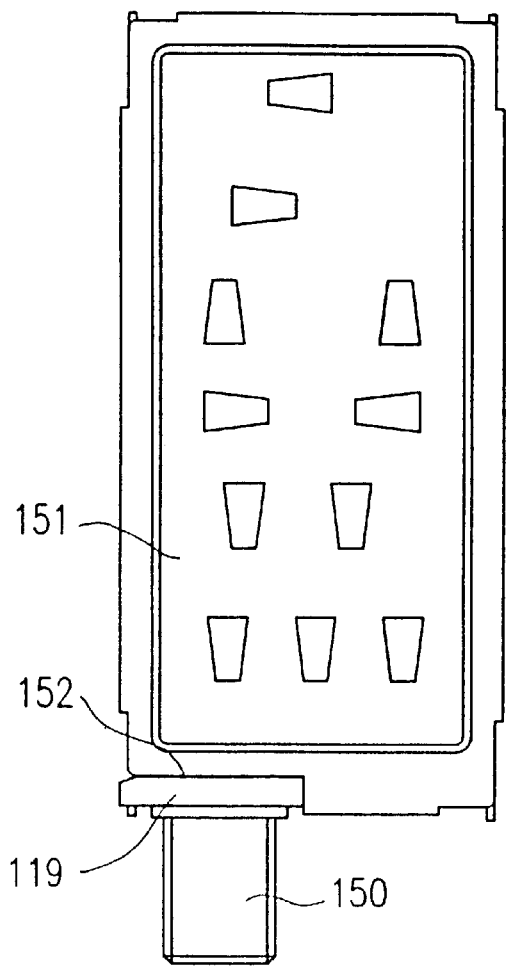
FIGS. 10A through 10C show the external appearance of a tuner structure in the tenth example of the present invention, to which an F-type connector and a shield cover have been attached.
Figure 10B:
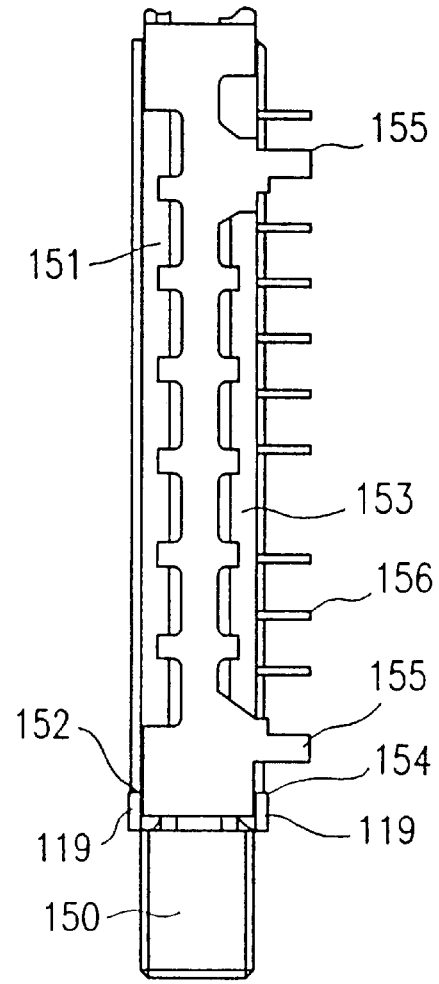
Figure 10C:
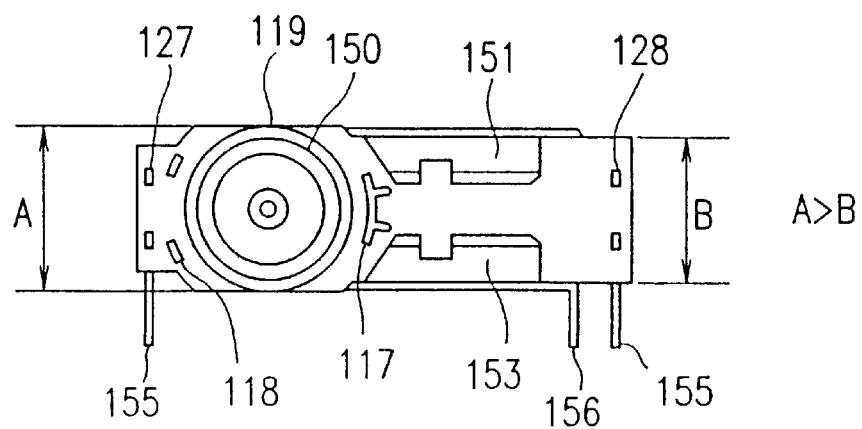
Figure 11A:
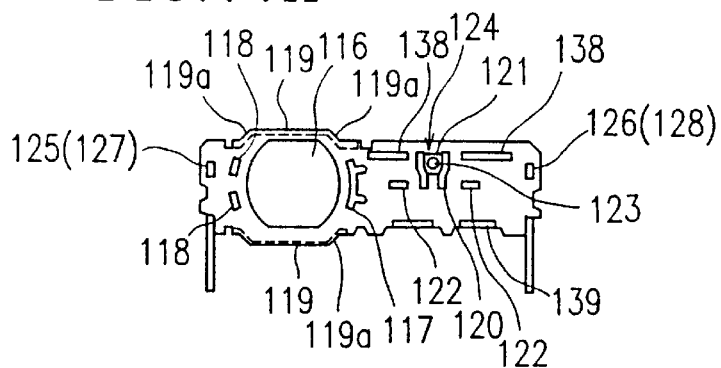
FIGS. 11A through 11D show an assembled chassis angle of the tuner structure in the tenth example of the present invention.
Figure 11B:
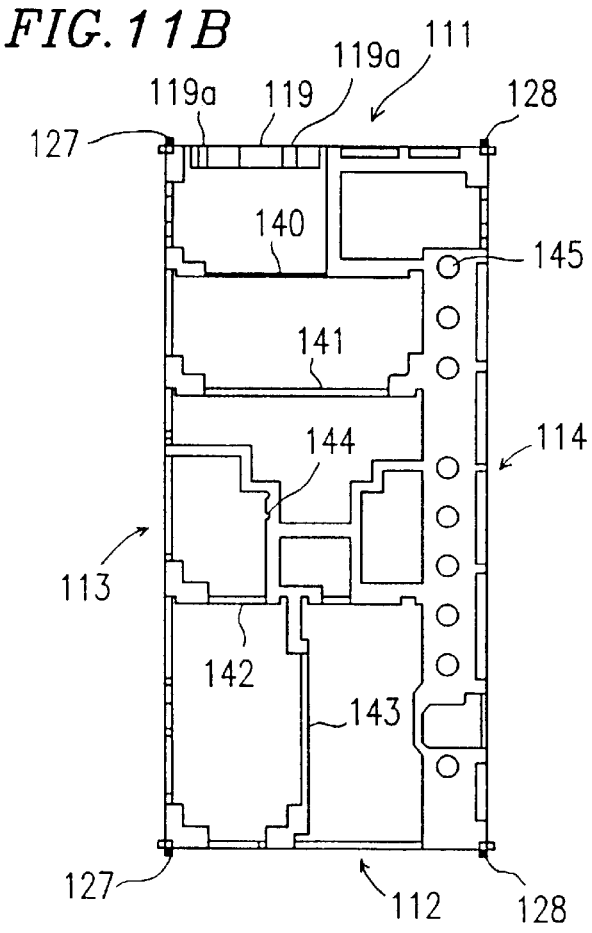
Figure 11C:
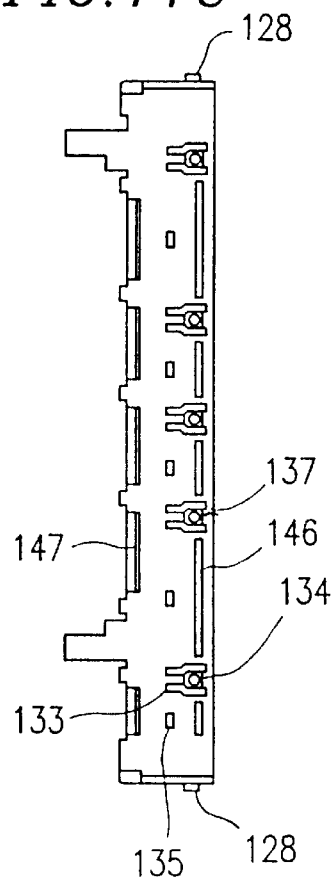
Figure 11D:
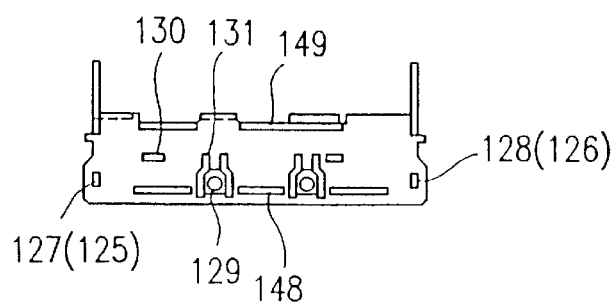

FIGS. 10A to 10C and 11A to 11D show a rectangular parallelepiped tuner structure of the present invention formed by subjecting the single metal plate 110 for a chassis case shown in FIG. 12 to press working, drawing, ejection drawing, bending and the like. FIGS. 11A through 11D show the chassis angle of the tuner structure of the present invention: FIG. 11A is a side view of the shorter chassis side 111; FIG. 11B is a plan view of the folded chassis angle; FIG. 11C is a side view of the longer chassis side 113; and FIG. 11D is a side view of the shorter chassis side 112. In FIGS. 11A through 11D, an F-type input connector (or an F contact tap) has not been mounted to the chassis angle yet. On the other hand, FIGS. 10A through 10C show the external appearance of the tuner structure of the present invention, to which the F-type connector and shield covers have already been attached: FIG. 10A is a plan view of the tuner structure; FIG. 10B is a side view of a longer side thereof; and FIG. 10C is a side view of a shorter side thereof.

As described above, since a single metal plate 110 for a chassis case is divided into the five regions, namely, the two shorter chassis sides 111 and 112, the two longer chassis sides 113 and 114 and the central chassis angle plane 115 as shown in FIG. 12, the respective sides 111 to 114 are mechanically coupled to the central chassis angle plane 115. As a result, a tuner structure having a high productivity and a high mechanical precision can be obtained.

As shown in FIG. 11A illustrating the shorter chassis side 111, the reference numeral 116 denotes a hole into which the input connector (an F-type connector or an F contact tap) is inserted and 117 and 118 denote ejected and drawn portions which have been ejected and drawn so as to downwardly protrude from the plane of the shorter chassis side 111 (i.e., to vertically and downwardly protrude from the paper sheet). The reference numeral 119 denotes a pair of outwardly drawn portions which are provided above and below the outer circumference of the hole 116 for inserting the F-type connector thereto and have been bent so as to vertically and downwardly protrude from the paper sheet and subjected to a drawing on the shoulder portions 119a thereof. The reference numeral 120 denotes stamped portions; 121 denotes an extruded pawl portion; and 122 denotes extruded and drawn portions which have been ejected and drawn so as to downwardly protrude from the plane of the shorter chassis side 111 (i.e., to vertically and downwardly protrude from the paper sheet). The reference numeral 123 denotes a navel-shaped protruding portion provided at the center of the extruded pawl portion 121; 124 denotes a stamped line stamped by a mold having a clearance of substantially zero; and 125 and 126 denote stamped portions to be respectively engaged with the engageable protruding portions 127 and 128 of the longer chassis sides 113 and 114, respectively, for forming a rectangular parallelepiped tuner structure by a twisting. The reference numerals 138 and 139 denote protruding portions for latching and securing the upper and lower shield covers, respectively, and have been ejected and drawn so as to upwardly protrude from the plane of the shorter chassis side 111 (i.e., to vertically and upwardly protrude from the paper sheet).

FIG. 11B is a plan view showing the central chassis angle plane 115 of the assembled chassis angle. The outer four sides of the tuner structure of the tenth example are formed by the two shorter chassis sides 111 and 112 and the two longer chassis sides 113 and 114. Three partition plates 140, 141 and 142 disposed in parallel to the shorter chassis sides 111 and 112, a single partition plate 143 disposed vertically to the sides 111 and 112, a bridge portion 144 having a shielding effect and nine holes 145 for inserting the feedthrough capacitors thereto also provided. The reference numeral 119 denotes outwardly drawn portions which are provided above and below the outer circumference of the hole 116 for inserting the F-type connector thereto and subjected to a drawing on the shoulder portions 119$a$ thereof. The portions 127 and 128 on the shorter chassis side 111 are the protruding portions for forming a rectangular parallelepiped tuner structure by a twisting (the portions 127 and 128 on the other shorter chassis side 112 have the same function).

In FIG. 11C showing the longer chassis side 114, the reference numeral 133 denotes stamped portions; 134 denotes extruded pawl portions; and 135 denotes extruded and drawn portions which have been extruded and drawn so as to downwardly protrude from the plane of the longer chassis side 114 (i.e., to vertically and downwardly protrude from the paper sheet). The reference numeral 136 denotes a navel-shaped protruding portion provided at the center of the extruded pawl portion 134; 137 denotes a stamped line stamped by a mold having a clearance of substantially zero; and 128 denotes engageable protruding portions for forming a rectangular parallelepiped tuner structure by a twisting. The reference numerals 146 and 147 denote protruding portions for latching and securing the upper and lower shield covers, respectively, and have been ejected and drawn so as to upwardly protrude from the plane of the longer chassis side 114 (i.e., to vertically and upwardly protrude from the paper sheet).

The shorter chassis side 112 shown in the side view of FIG. 11D is substantially the same as the shorter chassis side 111 shown in the side view of FIG. 11A except for the portion to which the input connector is mounted. In FIG. 11D, two extruded pawl portions 129, two extruded and drawn portions 130 and two pairs of stamped portions 131 and 132 function in the same way as the counterparts of the shorter chassis side 111. The reference numerals 148 and 149 denote protruding portions for latching and securing the upper and lower shield covers, respectively, and have been ejected and drawn so as to upwardly protrude from the plane of the shorter chassis side 112 (i.e., to vertically and upwardly protrude from the paper sheet).

FIGS. 10A through 10C show the external appearance of the tuner structure in the tenth example of the present invention, to which the F-type connector and shield covers have been attached: FIG. 10A is a plan view of the tuner structure; FIG. 10B is a side view of a longer side thereof; and FIG. 10C is a side view of a shorter side thereof.

In the plan view of FIG. 10A, the reference numeral 119 denotes outwardly drawn portions provided above and below the outer circumference of the hole 116 for inserting the F-type connector thereto; 150 denotes an F-type connector (or an F contact tap); 151 denotes an upper shield cover; and 152 denotes a notched portion of the shield cover 151. As shown in FIG. 10A, the notched portion 152 has been formed in such a shape as to be contacted with the outwardly drawn portion 119, thereby realizing a tuner structure having an external shape with a reduced thickness smaller than the height of the shorter chassis side including the protruding outwardly drawn portions 119. The mechanical strength of the tuner structure is increased by the outwardly drawn portions 119 and the ejected and drawn portions 117 and 118, while the thickness of the tuner structure is reduced by employing the notched portion 152 for the shield cover 151. That is to say, the tuner structure of the present invention has successfully fulfilled these contradictory requirements. The shield cover 151 is secured to the chassis angle via the protruding portions or latching structures 138, 139, 146, 147, 148 and 149 of the shorter chassis sides 111 and 112 and the longer chassis sides 113 and 114 as described with reference to FIGS. 11A through 11D.

Next, in the side view of the longer side shown in FIG. 10B, the reference numeral 119 denotes outwardly drawn portions; 150 denotes an F-type connector (or an F contact tap); 151 denotes an upper shield cover; 152 denotes a notched portion of the shield cover 151; 153 denotes a lower shield cover; 154 denotes a notched portion of the shield cover 153; 155 denotes legs for mounting the tuner structure; and 156 denotes the terminal bars of the feedthrough capacitors. Though not shown in FIG. 10B, the shape of the notched portion 154 of the lower shield cover 153 is the same as that of the notched portion 152 of the upper shield cover 151 as described with reference to FIG. 10A. The notched portion 154 of the lower shield cover 153 has been formed in such a shape so as to be in contact with the outwardly drawn portion 119, thereby realizing a tuner structure having an external shape with a reduced thickness smaller than the height of the shorter chassis side including the protruding outwardly drawn portions 119.

Next, in the side view of the shorter side shown in FIG. 10C, the reference numerals 117 and 118 denote ejected and drawn portions; 119 denotes outwardly drawn portions; 150 denotes an F-type connector (or an F contact tap); 127 and 128 denote engageable protruding portions which have been twisted; 151 denotes an upper shield cover; 153 denotes a lower shield cover; 155 denotes legs for mounting the tuner structure; and 156 denotes the terminal bars of the feedthrough capacitors. The ejected and drawn portions 117 and 118 have been ejected and drawn so as to downwardly protrude from the plane of the shorter chassis side 111 (i.e., to vertically and downwardly protrude from the paper sheet). Also, these ejected and drawn portions 117 and 118 are formed substantially as arcs parallel to the circumference of the circular hole 116 for inserting the F-type connector, thereby increasing the mechanical strength thereof. Furthermore, the circular ejected and drawn portion 117 is formed in a $\pi$ shape from which two corns protrude, thereby further increasing the mechanical strength thereof.

In FIG. 10C, assuming that the diameter of the surface of the F-type connector (input connector or F contact tap) to be contacted with the chassis angle is denoted by A and the thickness of the chassis angle is denoted by B, A=about 11.0 mm (standardized value) and B=about 9.2 mm (i.e., A>B) in the tuner structure of the present invention for a cable modem. In general, the thickness B of a chassis angle is in the range from about 8.8 mm to about 9.6 mm. In this case, the thickness of a single metal flat plate for forming the tuner structure is about 0.6 mm. On the other hand, the outer diameter of the threaded portion of an F-type connector is about 9.3 mm$\phi$. According to the present invention, the thickness of the chassis angle of the tuner structure can be as small as about 9.2 mmφ, which is smaller than the outer diameter of the threaded portion of the F-type connector.

As a result, an exemplary tuner structure of the present invention for a cable modem becomes a tuner structure of a horizontal mount type having an external size of about 11.5 mm (height)×about 70.2 mm (length)×about 32.2 mm (width) except for the protruding portion of the F-type connector (about 14.5 mm). The height of the tuner structure is about 11.5 mm, which is larger than the diameter of about 11.0 mm of the surface of the F-type connector to be contacted with the chassis angle by about 0.5 mm because of such factors as the thickness of the metal flat plate and the bulge of the shield covers.

Figure 13A:
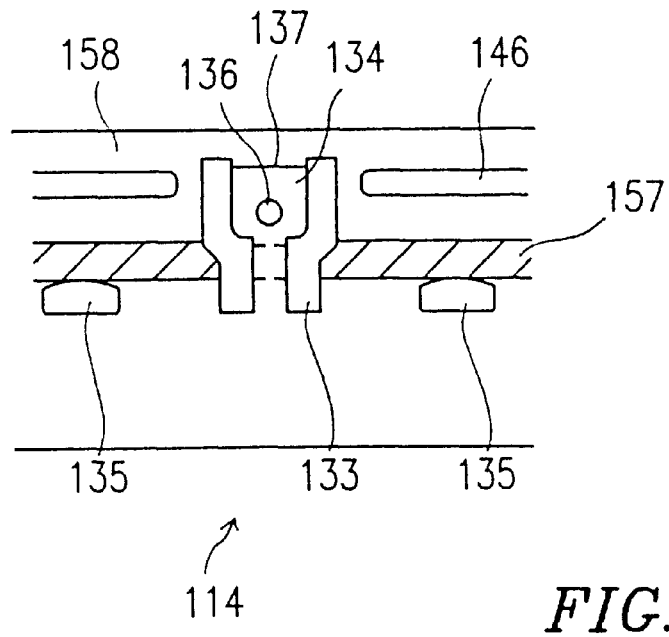
FIGS. 13A through 13C illustrate how a circuit board is incorporated into the tuner structure in the tenth example of the present invention.
Figure 13B:
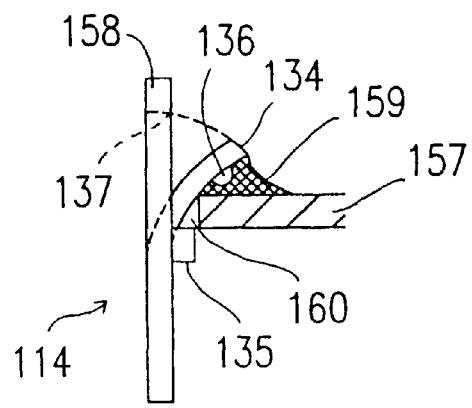
Figure 13C:
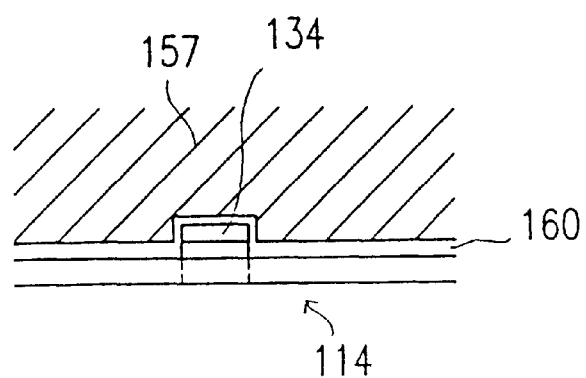

Next, it will be described how the circuit board is mounted onto the tuner structure. FIGS. 13A through 13C illustrate how the circuit board is mounted onto the longer chassis side 114 or 113: FIG. 13A is a plan view viewed from the longer chassis side 113; FIG. 13B is a cross-sectional view thereof; and FIG. 13C is a plan view thereof.

In FIG. 13A, the circuit board on which various electronic circuit components such as chip capacitors, chip resistors, semiconductor devices, diodes, ICs, coils and feedthrough capacitors have been mounted is represented by the hatching. The stamped portions 133, the extruded pawl portion 134 and the pair of extruded and drawn portions 135, which are provided on both sides of the extruded pawl portion 134, serve to retain the circuit board 157. The navel-shaped protruding portion 136 provided at the center of the extruded pawl portion 134 serves to suppress the flow of solder. The stamped line 137 on the upper side of the extruded pawl potion 134 is a line stamped by a mold having a clearance of substantially zero. A bridge portion 158 over the stamped line 137 of the longer chassis side 114 functions so as to increase the mechanical strength of the tuner structure. The reference numeral 146 denotes protruding portions for latching and securing the upper shield cover 151. The stamped portions 133 have a width of about 1 mm and function so as to apply some elasticity to the extruded pawl portion 134 (having a width of about 2 mm), thereby flexibly retaining the circuit board 157.

In FIG. 13B, the extruded pawl portion 134 and the navel-shaped protruding portion 136 (about 0.8 mmφ) provided at the center of the extruded pawl portion 134 function so as to remove a lot of fillets of the reflowed solder 159 from the surface of the circuit board 157. The reference numeral 114 denotes a longer chassis side; 135 denotes an extruded and drawn portion; 137 denotes a stamped line; and 158 denotes a bridge portion. The circuit board 157 is not in contact with the longer chassis side 114 but is retained via a certain gap 160. The gap functions as a buffer for preventing the circuit board 157 from being directly affected by some shock or distortion because of thermal or mechanical factors.

In FIG. 13C, the reference numeral 114 denotes a longer chassis side; 134 denotes an extruded pawl portion; 157 denotes a circuit board; and 160 denotes a gap between the longer chassis side 114 and the circuit board 157.

Figure 14A:
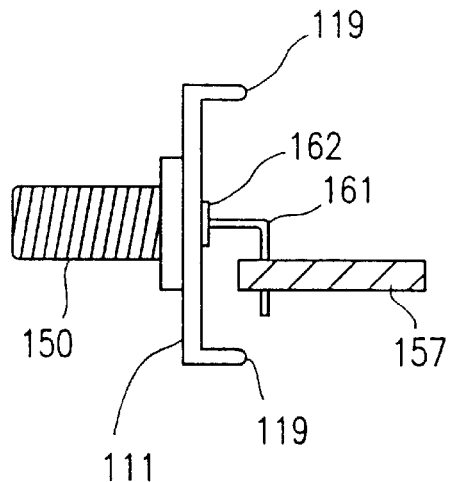
FIGS. 14A through 14C illustrate a structure for mounting an F-type connector onto the tuner structure in the tenth example of the present invention and how the caulking is performed.
Figure 14B:
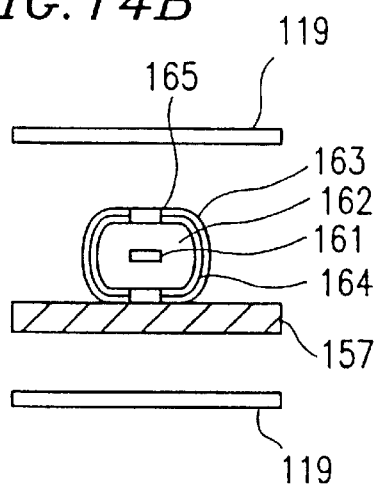
Figure 14C:
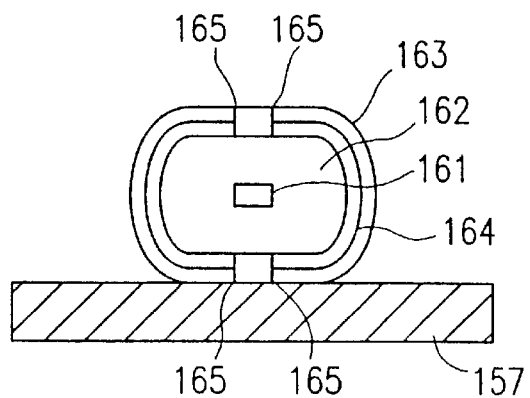

FIGS. 14A through 14C illustrate a structure for mounting an F-type connector and caulking: FIG. 14A is a side cross-sectional view showing a structure for mounting an F-type connector; FIG. 14B is a vertical cross-sectional view illustrating the caulking of the F-type connector; and FIG. 14C is a partial enlarged view of FIG. 14B.

FIG. 14A is a side cross-sectional view illustrating a structure for mounting an F-type connector. In FIG. 14A, the reference numeral 111 denotes a shorter chassis side; 119 denotes outwardly drawn portions; 150 denotes an F-type connector; 157 denotes a circuit board; 161 denotes a center pin of the F-type connector 150; 162 denotes a dielectric insulator surrounding the center pin 161 of the F-type connector 150. An electric signal is input/output through the center pin 161 connected to the circuit board 157.

FIG. 14B is a vertical cross-sectional view illustrating the caulking of the F-type connector as seen from the reverse side of the F-type connector 150. In FIG. 14B, the reference numeral 119 denotes outwardly drawn portions; 157 denotes a circuit board; 161 denotes a center pin of the F-type connector 150; 162 denotes a dielectric insulator surrounding the center pin 161 of the F-type connector 150; 163 denotes a caulking annulus for the F-type connector 150 (or the shell of the F-type connector 150); 164 denotes caulked portions; and 165 denotes a split portion between two caulked portions 164.

FIG. 14C is a partial enlarged view of FIG. 14B. In FIG. 14C, the reference numeral 157 denotes a circuit board; 161 denotes a center pin of the F-type connector 150; 162 denotes a dielectric insulator surrounding the center pin 161 of the F-type connector 150; 163 denotes a caulking annulus for the F-type connector 150; 164 denotes caulked portions; and 165 denotes a split portion between two caulked portions 164. The caulking annulus 163 is generally plated with nickel and thus has poor wettability with solder. However, since the original material or bronze is exposed on the surface of the caulked portions 164, the surface has satisfactory wettability with solder. When the assembly is dipped in solder, the split portion 165 between the caulked portions 164 functions as a port for absorbing solder and as a channel for supplying a sufficient amount of absorbed solder to the caulked portions 164. In a conventional caulking method, the four corners of a caulking annulus are caulked. However, according to the present invention, the portions 164 are caulked along the circumference of the caulking annulus 163. Since the split portion 165 also functions advantageously, the rotation strength of the caulked portions 164 can be improved up to three times or more (about 30 kg•cm) of that obtained by a conventional method.

Figure 15:
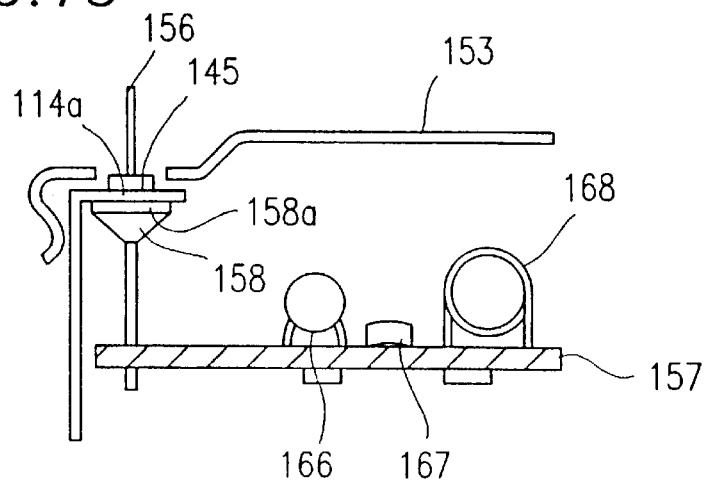
FIG. 15 is a side cross-sectional view for illustrating a structure for mounting a feedthrough capacitor onto the tuner structure in the tenth example of the present invention.

FIG. 15 is a side cross-sectional view for illustrating a structure for mounting a feedthrough capacitor, in which the feedthrough capacitor 158 has been inserted into a hole 145 for inserting a feedthrough capacitor. The hole 145 is provided through the central chassis angle plane 115. In FIG. 15, the reference numeral 157 denotes a circuit board; 166 denotes a capacitor; 167 denotes a chip component; 168 denotes a coil component; 153 denotes a lower shield cover; and 156 denotes a terminal bar of the feedthrough capacitor 158. As shown in FIG. 15, this structure is formed such that the feedthrough capacitor 158 is mounted from the inside of the chassis angle (or the central chassis angle plane 115). Though a feedthrough capacitor is mounted from the outside of a chassis angle in a conventional method, the feedthrough capacitor is inserted from the inside of the chassis angle according to the present invention. By employing this mounting structure, when solder is reflowed, the flux of solder, creamy solder, or the like, does not flow out, thereby preventing a case where a shield cover does not come into satisfactory contact with a chassis angle. The circuit board 157 on which various components and wires have been mounted is inserted into the chassis angle and then made to be engaged with the extruded navel-shaped portions 134 (not shown in FIG. 15) so as to form an assembly. Thereafter, a secondary solder dipping process is performed, thereby completing a tuner structure. If the feedthrough capacitor 158 is mounted from the opposite direction, i.e., from the outside of the chassis angle, then the solder flux expands on the contact surface 114a between the annulus 158a of the feedthrough capacitor 158 and the chassis angle. As a result, in some cases, the solder does not sufficiently reach the interface of the contact surface 114a between the annulus 158a of the feedthrough capacitor 158 and the chassis angle.

FIGS. 16A and 16B are side views illustrating various shapes of the partition plates to be disposed onto the central chassis angle plane 115 during the assembly of the tuner structure as described with reference to the plan view of FIG. 11B: FIG. 16A are side views showing only the shapes of the partition plates; and FIG. 16B are side views illustrating the positional relationships between the circuit board 157 and the partition plates of various shapes. In FIG. 16A, the reference numerals 140, 141 and 142 denote partition plates of various shapes. A partition plate of an appropriate shape is selected in accordance with the required degree of electrical shielding and the electrical wiring.

In the tenth example described with reference to FIG. 10A through FIG. 16B, the five regions, namely, the two shorter chassis sides 111 and 112, the two longer chassis sides 113 and 114 and the central chassis angle plane 115, are formed from a single metal plate 110 for a chassis case shown in FIG. 12. However, these regions are not necessarily formed from a single metal plate for a chassis case. For example, it is naturally possible to use three plates as the pair of shorter chassis sides 111 and 112, the pair of longer chassis sides 113 and 114 and the central chassis angle plane 115, respectively, in order to form a tuner structure.

EXAMPLE 11

Next, the eleventh example of the present invention will be described. The eleventh example relates to an implementation of the tuner structure of the tenth example as a cable modem tuner.

Figure 17A:
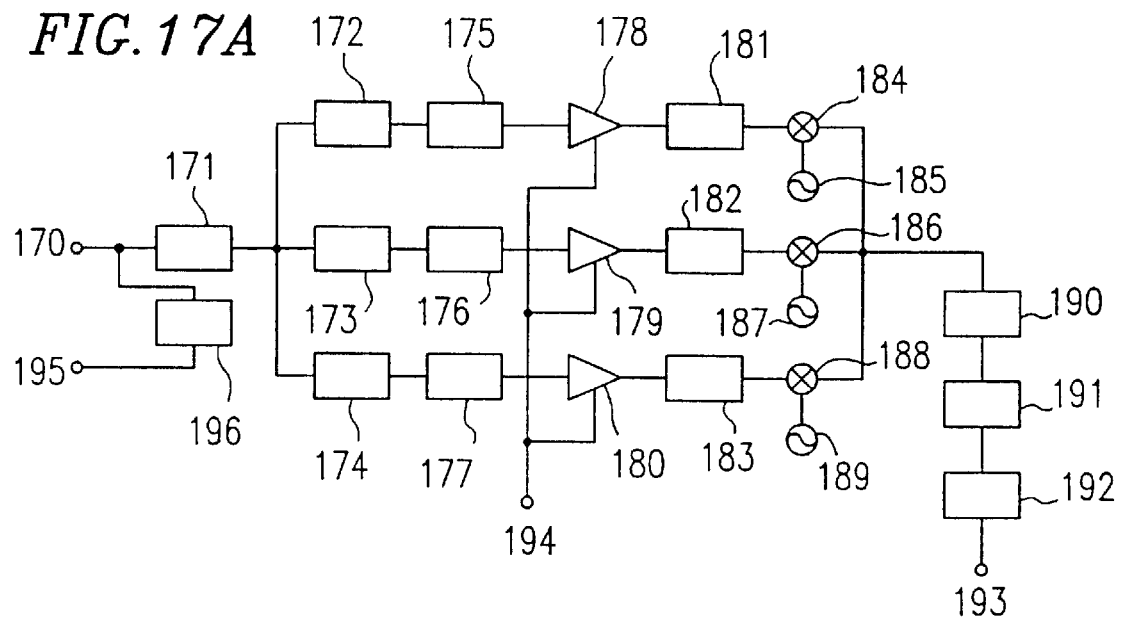
FIGS. 17A and 17B illustrate an exemplary cable modem tuner in the eleventh example of the present invention, to which the tuner structure in the tenth example of the present invention has been applied.
Figure 17B:
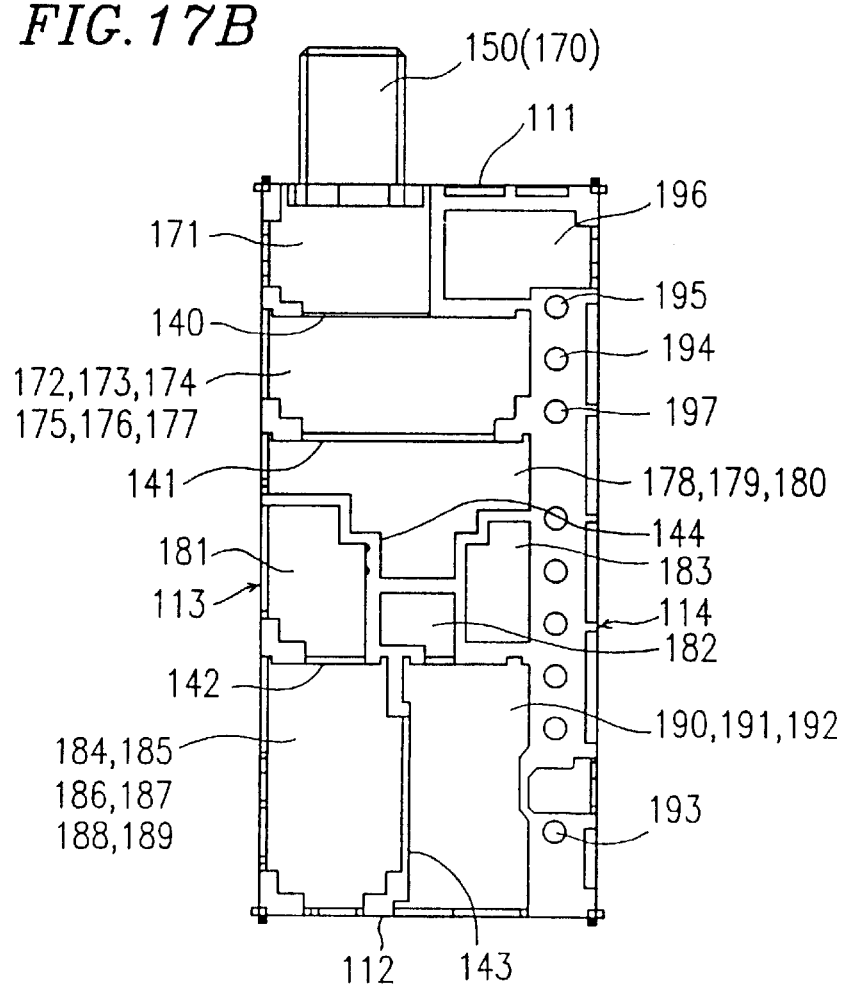
Figure 18:
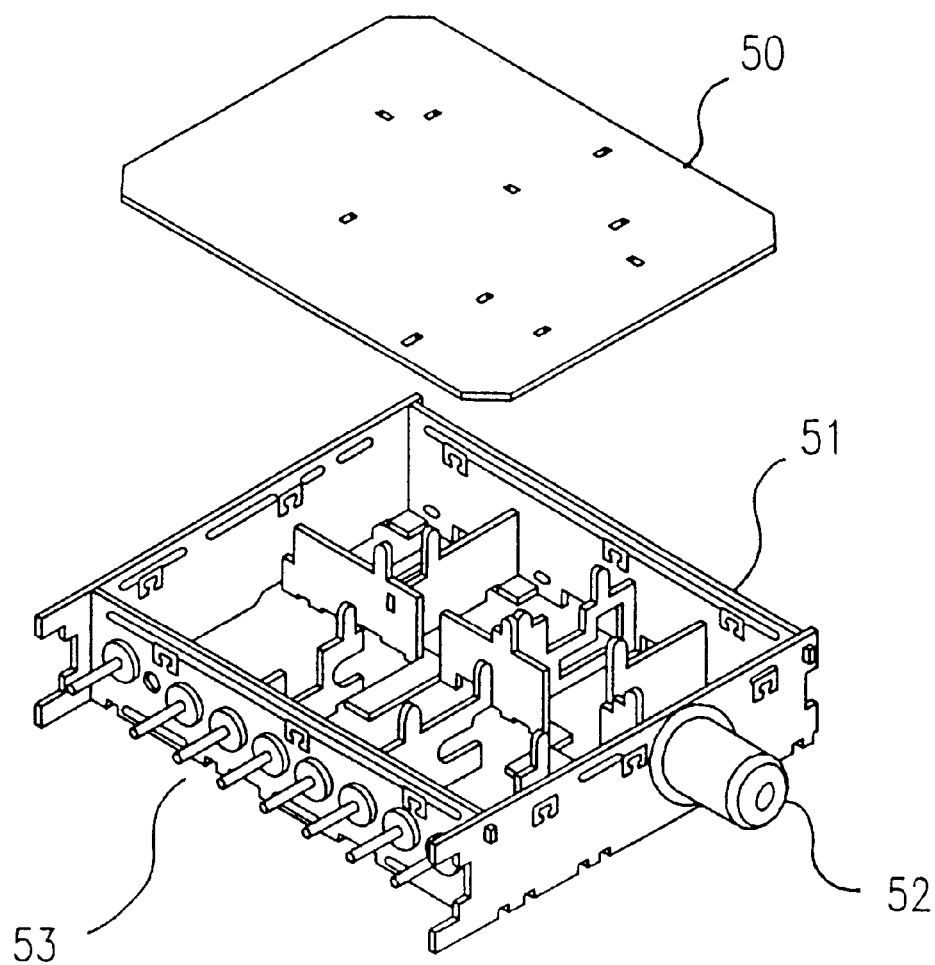
FIG. 18 is a perspective view of a conventional tuner structure.
Figure 19:
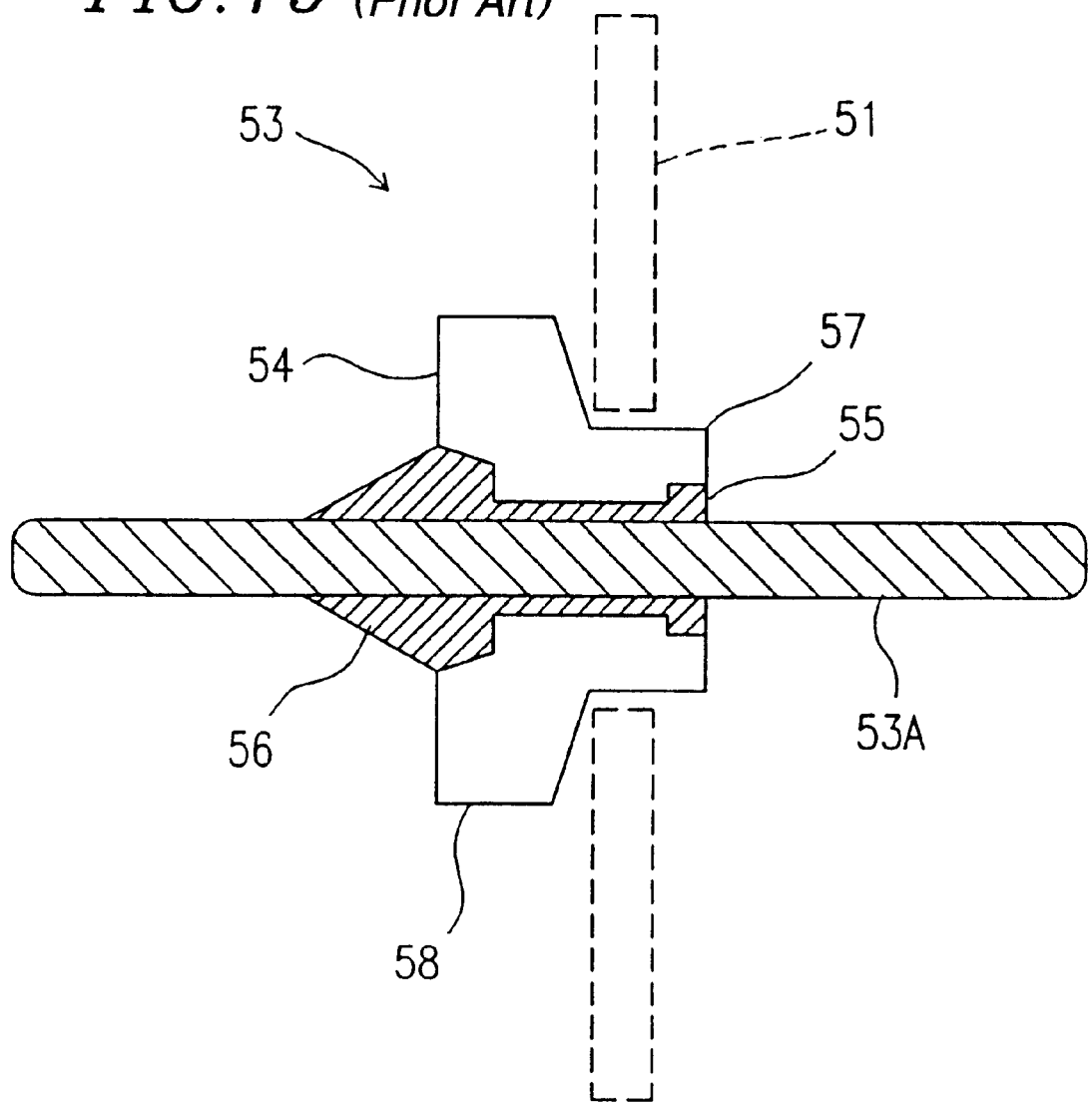
FIG. 19 is a schematic cross-sectional view of a feedthrough capacitor.
Figure 21A:
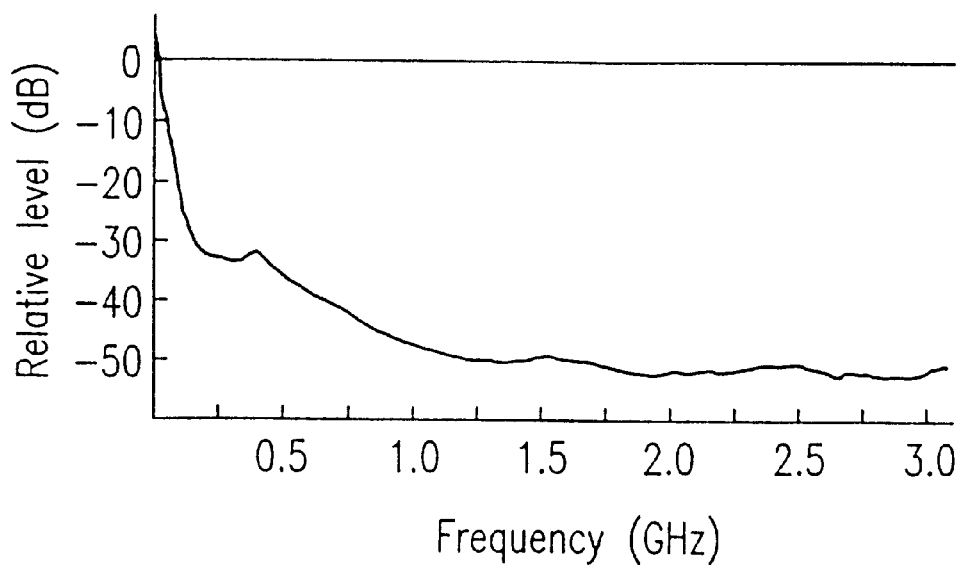
FIGS. 21A and 21B are respective graphs showing the measurement results representing the grounding effects for the case of using the feedthrough capacitor and the case of using the chip capacitor as a separate component.
Figure 21B:
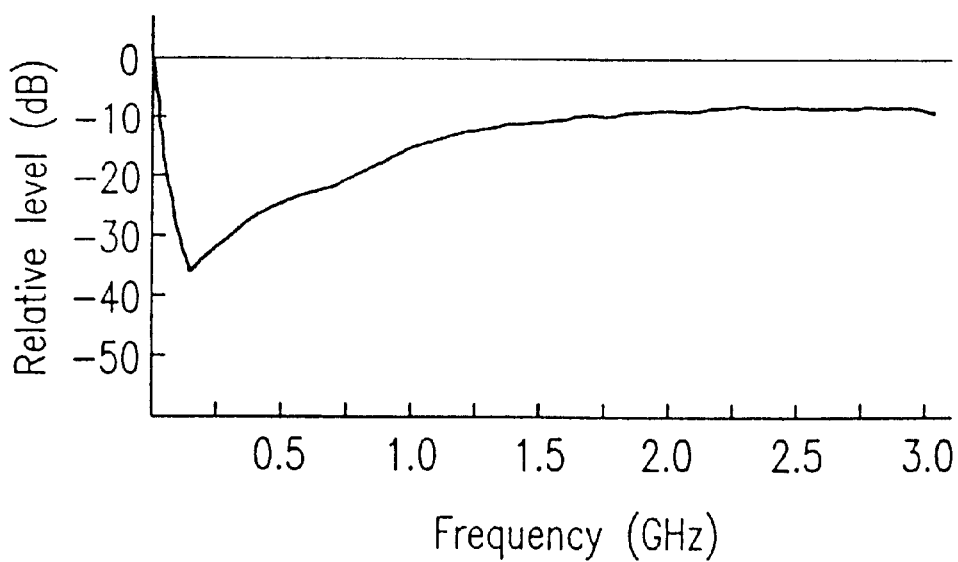
Figure 22A:
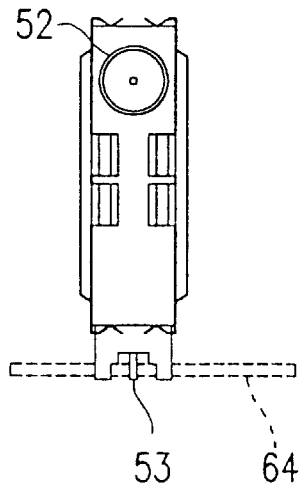
FIGS. 22A and 22B are views illustrating how a tuner is mounted onto a main substrate.
Figure 22B:
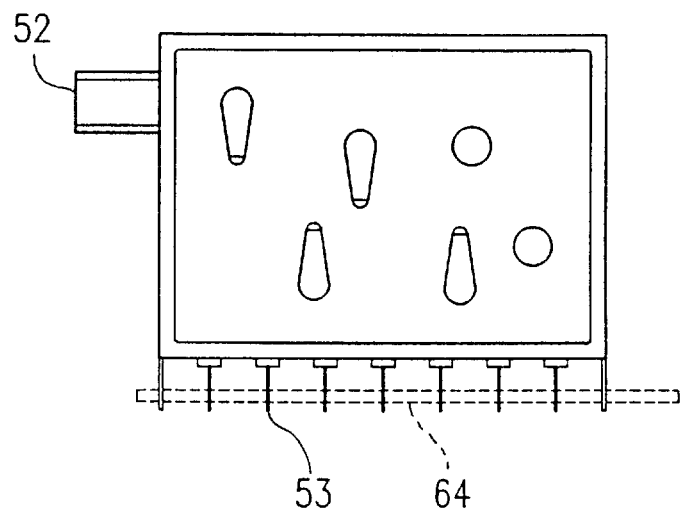
Figure 23A:
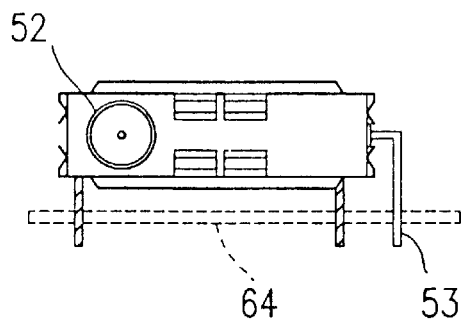
FIGS. 23A and 23B are views illustrating how a tuner is mounted onto a main substrate.
Figure 23B:
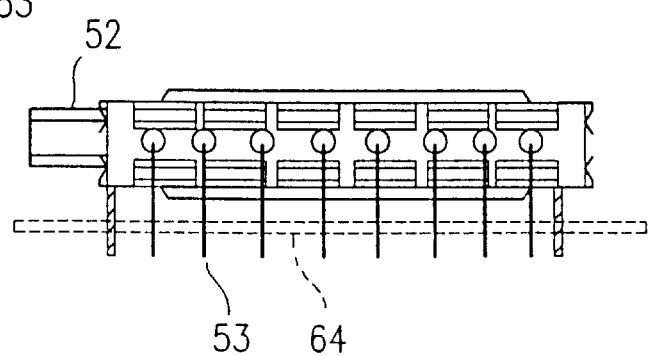
Figure 24:
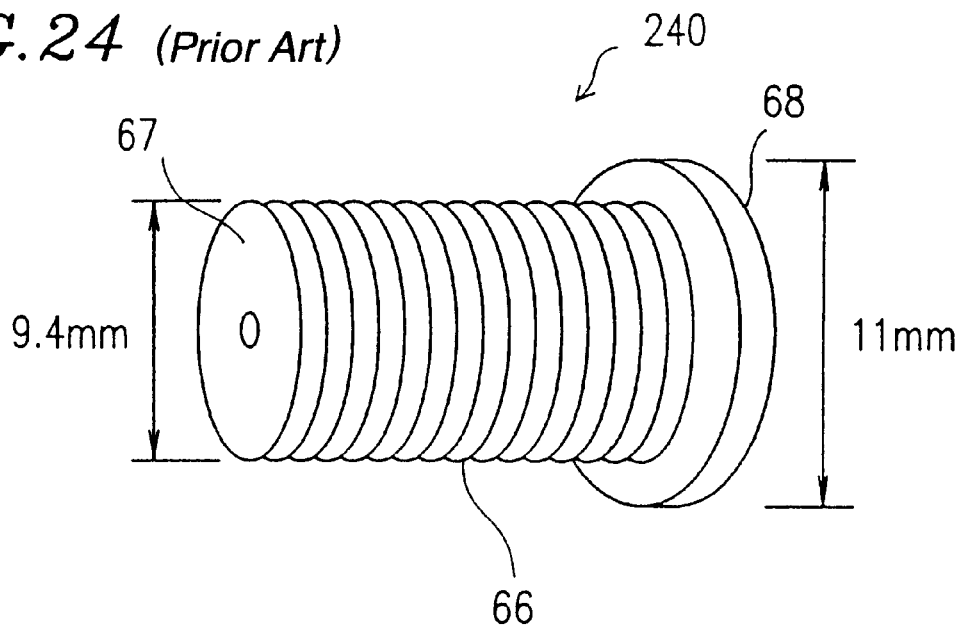
FIG. 24 is a perspective view of an F-type connector.
Figure 25:
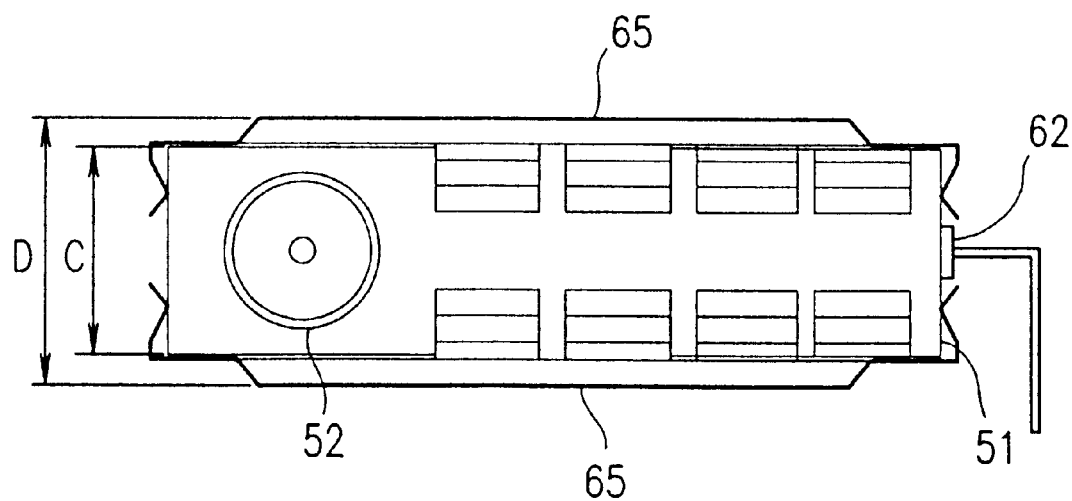
FIG. 25 is a plan view of a conventional tuner structure using the F-type connector.
Figure 26:
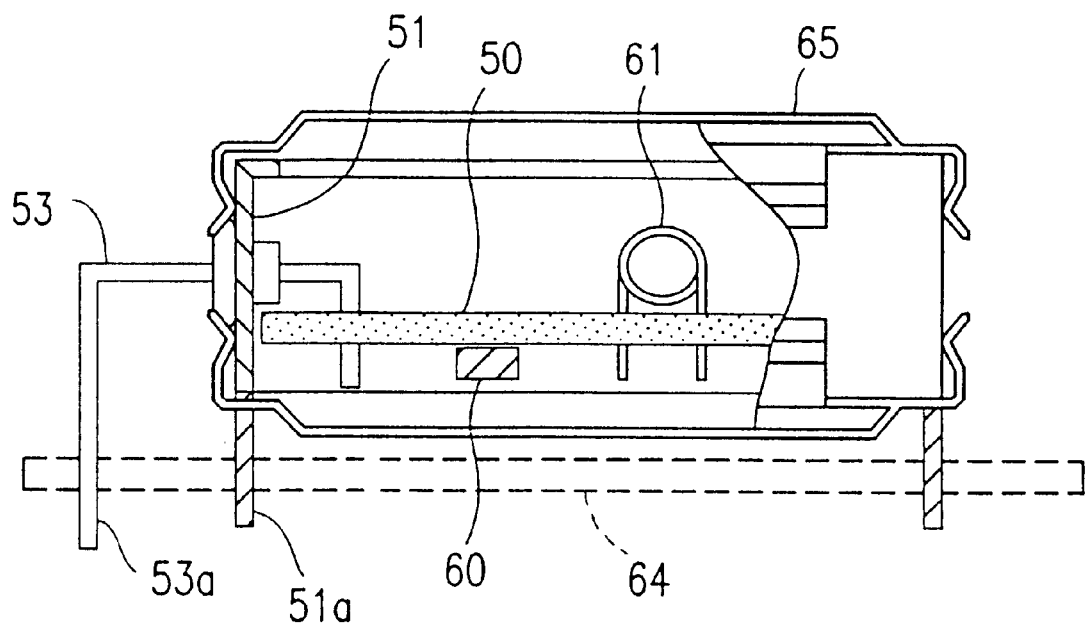
FIG. 26 is a schematic cross-sectional view of a conventional tuner structure.

FIGS. 17A and 17B illustrate an exemplary cable modem tuner in the eleventh example of the present invention: FIG. 17A is a block diagram showing electric circuit components formed in the cable modem tuner; and FIG. 17B is a plan view showing the arrangement of the respective electric circuit components shown in FIG. 17A in a tuner structure.

In the electric circuit block diagram of FIG. 17A, a CATV input signal is received at an input terminal (or an F-type connector) 170, passed through a high-pass filter (HPF) or an intermediate frequency (IF) filter 171 for removing an upstream signal of 5 to 46 MHz, and then supplied to input signal switching circuits 172, 173 and 174. The cable modem tuner includes receiver circuit sections respectively corresponding to the three divided bands of a UHF band (B3 band) for receiving a signal of 470 to 860 MHz, a VHF High band (B2 band) for receiving a signal of 170 to 470 MHz and a VHF Low band (B1 band) for receiving a signal of 54 to 170 MHz. The input signal switching circuits 172, 173 and 174 are used for the B1 band, the B2 band and the B3 band, respectively. The CATV signal is divided into signal components corresponding to these three bands, which are tuned to desired signals by radio frequency amplifier input tuner circuits 175, 176 and 177, respectively. The tuned signals are amplified by radio frequency amplifiers 178, 179 and 180, respectively. The amplified output signals are tuned by radio frequency amplifier output tuner circuits 181, 182 and 183, respectively, and then converted into intermediate frequency (IF) signals by local oscillator circuits (parallel type local oscillator circuits) 185, 187 and 189 and mixer circuits 184, 186 and 188, respectively. Then, the IF signals are supplied to an IF amplifier circuit 190, passed through a SAW filter circuit 191 and an IF filter circuit 192 and then output to an output terminal 193. The reference numeral 194 denotes an AGC terminal.

On the other hand, a data signal, which has been input through a data terminal 195, is passed through an upstream circuit 196 so as to be connected to the CATV signal input terminal 170.

In the plan view of FIG. 17B showing the arrangement of the respective electric circuit components shown in FIG. 17A in a tuner structure, the input connector 150 functions as the CATV signal input terminal 170, the high-pass filter 171 and the upstream circuit 196 are provided between the partition plate 140 and the shorter chassis side 111, and one of the feedthrough capacitors is assigned to the data terminal 195.

The input signal switching circuits 172, 173 and 174 and the radio frequency amplifier input tuner circuits 175, 176 and 177 are provided between the partition plates 140 and 141 and another feedthrough capacitor is assigned to the AGC terminal 194.

The radio frequency amplifiers 178, 179 and 180 are provided between the partition plate 141 and the bridge 144 and the radio frequency amplifier output tuner circuits 181, 182 and 183 are provided between the bridge 144 and the partition plate 142. Another feedthrough capacitor is assigned to a power supply terminal 197.

The mixer circuits 184, 186 and 188 and the local oscillator circuits 185, 187 and 189 are provided in the region surrounded by the partition plates 142 and 143, the shorter chassis side 112 and the longer chassis side 113.

The IF amplifier circuit 190, the SAW filter circuit 191 and the IF filter circuit 192 are provided in the region surrounded by the partition plates 142 and 143, the shorter chassis side 112 and the longer chassis side 114. Another feedthrough capacitor is assigned to the output terminal 193. By providing appropriate partition plates 140, 141, 142 and 143 as described with reference to FIGS. 16A and 16B, designing and arranging the respective circuit components as shown in FIG. 17B and utilizing the tuner structure of the present invention, various electric characteristics can be improved with respect to a spurious level at the input terminal, addition of a duplexor circuit and measures against an incoming disturbance signal. These effects will be described in detail below.

1) Spurious level at the input terminal

As compared with a conventional example, the spurious level at the input terminal 170 can be improved by 10 to 20 dB in accordance with the present invention. This effect can be confirmed by specific spurious level values of −35 dBmV or less in the VHF band and −30 dBmV or less in the UHF band.

2) Addition of a duplexor circuit

Since a signal of +50 dBmV to +60 dBmV is applied to the data terminal 195, an induction coupling to the radio frequency amplifier input tuner circuits 175 to 177 is likely to be caused inside the cable modem tuner. However, according to the present invention, a shielding plate or the partition plate 140 (see FIG. 16A and FIG. 17B) is interposed between the data terminal 195 and the radio frequency amplifier input tuner circuits 175 to 177, thereby solving this problem.

3) Incoming noise (measures against incoming disturbance signals)

According to the present invention, since the feedthrough capacitors are used as the power supply terminal 197, the data terminal 195, the AGC (PLL control) terminal 194 and the output terminal 193, various radio frequency noises incoming to the respective terminals such as an SW power supply noise and digital noise can be reduced.

4) Improvement of shielding effects of a cable modem tuner

A cable modem tuner is connected to a cable line as a CATV appliance. In this case, it is necessary to prevent other appliances (such as a set top converter) from being disturbed by the spurious of the tuner. Thus, as compared with a conventional TV tuner, the spurious level at the input terminal of the cable modem tuner must be improved. As described above, in the tuner structure of the present invention, such a spurious disturbance can be satisfactorily prevented.

Moreover, though a cable modem tuner to which a duplexor circuit has been integrated can bidirectionally transmit and receive data, a conventional TV tuner has no function of mixing an upstream signal and thus a duplexor circuit must be additionally provided therefor. When such a circuit is added, the filter thereof must be shielded. However, since the tuner structure of the present invention has a shielding effect as described above, it has only to additionally provide a duplexor circuit therefor.

Furthermore, since a cable modem tuner is a peripheral component of a personal computer, the tuner is disposed in the vicinity of the personal computer in most cases. As the cable modem is frequently exposed to digital noises generated from the personal computer, it is necessary to take some measures against the incoming disturbance signals. In the tuner structure of the present invention, sufficient measures have been taken against such an incoming disturbance signal as described above.

As is apparent from the foregoing description, the tuner structure of the present invention includes: a circuit board on which electronic circuit components such as transistors and resistors have been mounted; a chassis angle; and a shield cover. In the tuner structure, a feedthrough capacitor for inputting/outputting a power, a control signal and the like is mounted to a metal plate disposed in parallel to the circuit board. As a result, the total height of the tuner structure can be lowered. In addition, since the leg of the feedthrough capacitor is disposed between the legs of the chassis angle, the area occupied by the tuner structure on the surface of the main substrate can be reduced.

Moreover, by using the tuner structure of the present invention, a feedthrough capacitor, which has conventionally been difficult to incorporate into a tuner structure in view of the reduction in thickness of the tuner structure, can now be incorporated into the tuner structure. Since the feedthrough capacitor has excellent noise elimination ability, the tuner structure becomes applicable to an extended board of a personal computer or the like, which exists in an environment having extremely high-level noise.

In one embodiment of the tuner structure according to the present invention, the metal plate to which the feedthrough capacitor is mounted has been subjected to mechanical processing, thereby further lowering the total height of the tuner structure and increasing the mechanical strength thereof.

In another embodiment of the tuner structure according to the present invention, the feedthrough capacitor is mounted to a metal ground plate provided separately from the chassis angle so that the positions and the number of the legs of the metal ground plate to be inserted into the circuit board can be arbitrarily set. In addition, the grounding effects of the feedthrough capacitor and the circuit board can be improved as compared with a conventional tuner structure.

In still another embodiment of the tuner structure according to the present invention, the metal ground plate has a box shape, thereby improving the shielding effects. Moreover, if an oscillator coil is introduced into the box-shaped metal ground plate, for example, then it is possible to prevent other circuits mounted on the circuit board (e.g., RF amplifier circuits) from being interfered with by the radiation waves generated by the oscillator coil.

In still another embodiment of the tuner structure according to the present invention, the chassis angle is formed by assembling a metal plate to which an input connector is mounted into another folded metal plate. As a result, the material and the thickness of the chassis angle can be arbitrarily selected, an arbitrary drawing can be performed at a desired folding size, the input connector can be mounted to an arbitrary position of the metal plate, the flexibility of design can be improved and an optimum metal plate can be used as the metal plate for mounting the input connector thereto. Consequently, a tuner structure with a reduced thickness can be obtained at a lower cost.

In still another embodiment of the tuner structure according to the present invention, the metal plate to which the input connector is mounted has a portion having an increased width so that a metal plate having a width smaller than the diameter of the input connector on the surface to be contacted with the side of the chassis angle (except for the portion having an increased width) can be used for mounting the input connector thereto. Consequently, a tuner structure with a reduced thickness can be obtained at a lower cost.

In still another embodiment of the tuner structure according to the present invention, the metal plate to which the input connector is mounted has a plurality of small holes. Consequently, the precision of the external size of the chassis angle is not deteriorated since solder does not collect on the metal plate when the chassis angle is dipped in the solder.

The tuner structure according to another aspect of the present invention includes: a circuit board on which electronic circuit components such as transistors and resistors have been mounted; a chassis angle; and a shield cover. In the tuner structure, a pin header for inputting/outputting a power, a control signal and the like is mounted to a metal plate disposed in parallel to the circuit board. As a result, the total height of the tuner structure can be lowered. In addition, since the legs of the pin header are disposed between the legs of the chassis angle, the area occupied by the tuner structure on the surface of the main substrate can be reduced.

The tuner structure according to still another aspect of the present invention includes a circuit board on which electronic circuit components such as transistors, resistors and feedthrough capacitors have been mounted; a chassis angle including a pair of shorter chassis sides, a pair of longer chassis sides and a central chassis angle plane; a shield cover; and an input connector. The tuner structure is characterized in that, when an outer diameter of a surface of the input connector to be contacted with one of the pair of shorter chassis sides of the chassis angle and a thickness of the chassis angle are denoted by A and B, respectively, a relationship A>B is satisfied. Thus, a tuner structure in which the thickness of the chassis angle is smaller than the outer diameter of the F-type connector to be contacted with the shorter chassis side of the chassis angle and the chassis angle has a large strength (about 20 kg•cm or more) can be obtained.

In one embodiment of the tuner structure of the present invention, one of the pair of shorter chassis sides of the chassis angle, to which the input connector is mounted, is provided with ejected and drawn portions and outwardly drawn portions around an outer circumference of a hole for inserting the input connector thereto. As a result, a tuner structure of a horizontal amount type having an external size of about 11.5 mm (height)×about 70.2 mm (length)×about 32.2 mm (width) can be obtained.

In another embodiment of the tuner structure of the present invention, each of the pair of longer chassis sides of the chassis angle is provided with ejected and drawn portions and extruded pawl portions, thereby forming a structure for retaining the circuit board. In the structure, the circuit board is not directly in contact with the longer chassis side but retained via a certain gap therebetween. Thus, a tuner structure can be obtained in which it is possible to prevent the circuit board from being directly affected by some shock or distortion because of thermal or mechanical factors.

In still another embodiment of the tuner structure of the present invention, a structure for mounting the feedthrough capacitors onto the circuit board from an inside of the chassis angle is further provided. As a result, when the solder is reflowed, the flux of solder, creamy solder or the like does not flow out, thereby preventing a case where a shield cover does not come into satisfactory contact with a chassis angle.

In still another embodiment of the tuner structure of the present invention, a notched portion is provided for the shield cover so as to come into contact with one of the outwardly drawn portions of the shorter chassis side of the chassis angle to which the input connector is mounted. As a result, a smaller sized tuner structure with a reduced thickness can be obtained.

In still another embodiment of the tuner structure of the present invention, the pair of shorter chassis sides, the pair of longer chassis sides and the central chassis angle plane of the chassis angle are formed by processing a single metallic flat plate. As a result, a tuner structure in which the respective sides are mechanically coupled to the central chassis angle plane and which has a high productivity and a high mechanical precision can be obtained.

Moreover, by using the tuner structure of the present invention, a smaller sized tuner structure having an external size of about 11.5 mm (height)×about 70.2 mm (length)× about 32.2 mm (width) can be obtained, the rotation strength thereof can be increased up to 20 kg•cm to 30 kg•cm or more and a tensile strength of 10 kg or more is realized.

According to still another aspect of the present invention, a cable modem tuner including the tuner structure of the present invention is provided. The cable modem tuner of the present invention includes a tuner structure including: a circuit board on which electronic circuit components such as transistors, resistors and feedthrough capacitors have been mounted; a chassis angle including a pair of shorter chassis sides, a pair of longer chassis sides and a central chassis angle plane; a shield cover; and an input connector, an outer diameter A of a surface of the input connector to be contacted with one of the pair of shorter chassis sides of the chassis angle being larger than a thickness B of the chassis angle. The cable modem tuner of the present invention further includes: radio frequency amplifier input tuner circuits corresponding to respectively different frequency bands; radio frequency amplifiers; radio frequency amplifier output tuner circuits; frequency converter circuits; local oscillator circuits; an intermediate frequency amplifier circuit; an SAW filter circuit; an intermediate frequency amplifier circuit as a post stage amplifier circuit; and PLL selector circuits. The electric characteristics of the cable modem tuner can be sufficiently improved in respect of a spurious level at the input terminal, the addition of a duplexor circuit and the measures against an incoming disturbance signal.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A tuner structure comprising:
   a circuit board on which electronic circuit components including transistors and resistors have been mounted,
   a chassis angle configured for mounting on a substrate, and
   a shield cover attached to said chassis angle;
   wherein a feedthrough capacitor for inputting/outputting a power signal and a control signal is mounted to a metal plate disposed in parallel to the circuit board, and
   wherein the metal plate is attached to said chassis angle and is spaced apart from the surfaces of the chassis angle that are parallel thereto.

2. A tuner structure according to claim 1, wherein the metal plate to which the feedthrough capacitor is mounted has been subjected to mechanical processing.

3. A tuner structure according to claim 2, wherein the metal plate is mechanically processed to have a concavity.

4. A tuner structure according to claim 3, wherein the concavity extends toward said circuit board.

5. A tuner structure according to claim 1, wherein the feedthrough capacitor is mounted to a metal ground plate in contact with the chassis angle.

6. A tuner structure according to claim 1, wherein an oscillator circuit is mounted on the circuit board.

7. A tuner structure according to claim 1, wherein the feedthrough capacitor extends through the circuit board and reaches the substrate.

* * * * *